US012751154B2

(12) United States Patent
Yoon et al.

(10) Patent No.: US 12,751,154 B2
(45) Date of Patent: Sep. 29, 2026

(54) DISPLAY APPARATUS WITH CONNECTION ELECTRODE IN NON-LIGHT EMISSION AREA

(71) Applicant: LG Display Co., Ltd., Seoul (KR)

(72) Inventors: HuSik Yoon, Paju-si (KR); HyunHaeng Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 555 days.

(21) Appl. No.: 18/229,392

(22) Filed: Aug. 2, 2023

(65) Prior Publication Data

US 2024/0057401 A1 Feb. 15, 2024

(30) Foreign Application Priority Data

Aug. 10, 2022 (KR) ........................ 10-2022-0099975

(51) Int. Cl.
*H10K 59/124* (2023.01)
*H10K 59/131* (2023.01)

(52) U.S. Cl.
CPC ......... *H10K 59/124* (2023.02); *H10K 59/131* (2023.02)

(58) Field of Classification Search
CPC .. H10K 59/124; H10K 59/131; H10K 59/873; H10K 50/11; H10K 50/813; H10K 50/822; H10K 50/844
See application file for complete search history.

(56) References Cited

U.S. PATENT DOCUMENTS

2011/0063267 A1 3/2011 Sim et al.
2019/0012031 A1* 1/2019 Kim ........................ G02B 5/305
2019/0165323 A1 5/2019 Jo et al.

FOREIGN PATENT DOCUMENTS

KR 10-2011-0030211 A 3/2011
KR 10-2017-0114223 A 10/2017
KR 10-2019-0063963 A 6/2019

OTHER PUBLICATIONS

Office Action dated Jan. 20, 2026 issued in corresponding Korean Patent Application No. 10-2022-0099975.

* cited by examiner

*Primary Examiner* — John P. Dulka
(74) *Attorney, Agent, or Firm* — Morgan, Lewis & Bockius LLP

(57) ABSTRACT

A disclosed display apparatus may include a substrate having a light emission area, including a pixel, and a non-light emission area in a periphery of the light emission area; a plurality of split lines spaced apart from each other in the non-light emission area, the split lines being configured to provide a signal for driving the pixel; a planarization layer in the non-light emission area and overlapping with a portion of each of the split lines; and a connection electrode covering the planarization layer in the non-light emission area and connecting the split lines to each other. The planarization layer may include a central area and an edge area in a periphery of the central area, the central area having a different thickness from the edge area.

24 Claims, 10 Drawing Sheets

DISPLAY APPARATUS WITH CONNECTION ELECTRODE IN NON-LIGHT EMISSION AREA

CROSS-REFERENCE TO RELATED APPLICATION

This application claims the benefit of and the priority to Korean Patent Application No. 10-2022-0099975, filed on Aug. 10, 2022, which is hereby incorporated by reference as if fully set forth herein.

BACKGROUND

Technical Field

The present disclosure relates to a display apparatus for displaying an image.

Description of the Related Art

With the advancement of the information age, the demand for a display apparatus for displaying an image has increased in various forms. Therefore, various types of display apparatuses, such as a liquid crystal display (LCD) apparatus, a plasma display panel (PDP) apparatus, an organic light emitting display (OLED) apparatus, and a quantum dot light emitting display (QLED) apparatus, have been recently used.

Among the display apparatuses, the organic light emitting display apparatus and the quantum dot light emitting display apparatus are self-light emitting types and have advantages in that they typically provide for a greater viewing angle and a better contrast ratio than the liquid crystal display (LCD) apparatus. Also, since the organic light emitting display apparatus and the quantum dot light emitting display apparatus do not require a separate backlight, they have advantages of being thin and lightweight and having low power consumption. The organic light emitting display apparatus includes a light emission area (or a display area) from which light is emitted, and a non-light emission area in the periphery of the light emission area. A plurality of lines connected to lines of the light emission area, supplying an image signal and/or a power source are disposed in the non-light emission area. The organic light emitting display apparatus is manufactured through various processes.

Static electricity may be generated by contact with another object in a manufacturing process of the organic light emitting display apparatus. The static electricity may affect the plurality of lines disposed in the non-light emission area to cause a defect of the organic light emitting display apparatus.

SUMMARY

The present disclosure is directed to a display apparatus that substantially obviates one or more of the problems due to limitations and disadvantages of the related art.

The present disclosure has been made in view of the above problems, and it is an object of the present disclosure to provide a display apparatus that may prevent a potential damage or defect from occurring due to static electricity.

It is another object of the present disclosure to provide a display apparatus in which a connection electrode formed on a planarization layer in a non-light emission area (or gate driver) has a uniform thickness.

It is other object of the present disclosure to provide a display apparatus in which a horizontal line defect may be prevented from occurring.

In addition to the objects of the present disclosure as mentioned above, additional objects, features, and aspects of the present disclosure will be set forth in the description that follows and in part will become apparent from the description or may be learned by practice of the inventive concepts provided herein. Other features and aspects of the inventive concepts may be realized and attained by the structure particularly pointed out in, or derivable from, the written description, claims hereof, and the appended drawings.

To achieve these objects and other advantages of the present disclosure, as embodied and broadly described herein, a display apparatus may include: a substrate having a light emission area, including a pixel, and a non-light emission area in a periphery of the light emission area; a plurality of split lines spaced apart from each other in the non-light emission area, the split lines being configured to provide a signal for driving the pixel; a planarization layer in the non-light emission area and overlapping with a portion of each of the split lines; and a connection electrode covering the planarization layer in the non-light emission area and connecting the split lines to each other. The planarization layer may include a central area and an edge area in a periphery of the central area, the central area having a different thickness from the edge area.

In another aspect of the present disclosure, a display apparatus may include: a substrate having a light emission area, including a pixel, and a non-light emission area in a periphery of the light emission area; a plurality of split lines spaced apart from each other in the non-light emission area, the split lines being configured to provide a signal for driving the pixel; a passivation layer covering a portion of each of the split lines; a planarization layer on the passivation layer; and a connection electrode covering the planarization layer and the passivation layer and connecting the split lines to each other. The connection electrode may have a stair shape extending upward from a portion in contact with one of the split lines toward a central area of the planarization layer.

In yet another aspect of the present disclosure, a display apparatus may include: a substrate having a light emission area, including a pixel, and a non-light emission area in a periphery of the light emission area, the non-light emission area including a pad area having a plurality of pads; a first split line in the non-light emission area and connected to one of the pads in the pad area; a second split line spaced apart from the first split line in the non-light emission area and connected to a line in the light emission area connected to the pixel; a planarization layer overlapping with a portion of each of the first and second split lines in the non-light emission area; and a connection electrode covering the planarization layer and electrically connecting the first split line with the second split line. The planarization layer may include a central area and an edge area in a periphery of the central area, the central area having a different thickness from the edge area.

It is to be understood that both the foregoing general description and the following detailed description of the present disclosure are by way of example and are intended to provide further explanation of the disclosures as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principles of the disclosure. In the drawings.

DETAILED DESCRIPTION

Figure 1:
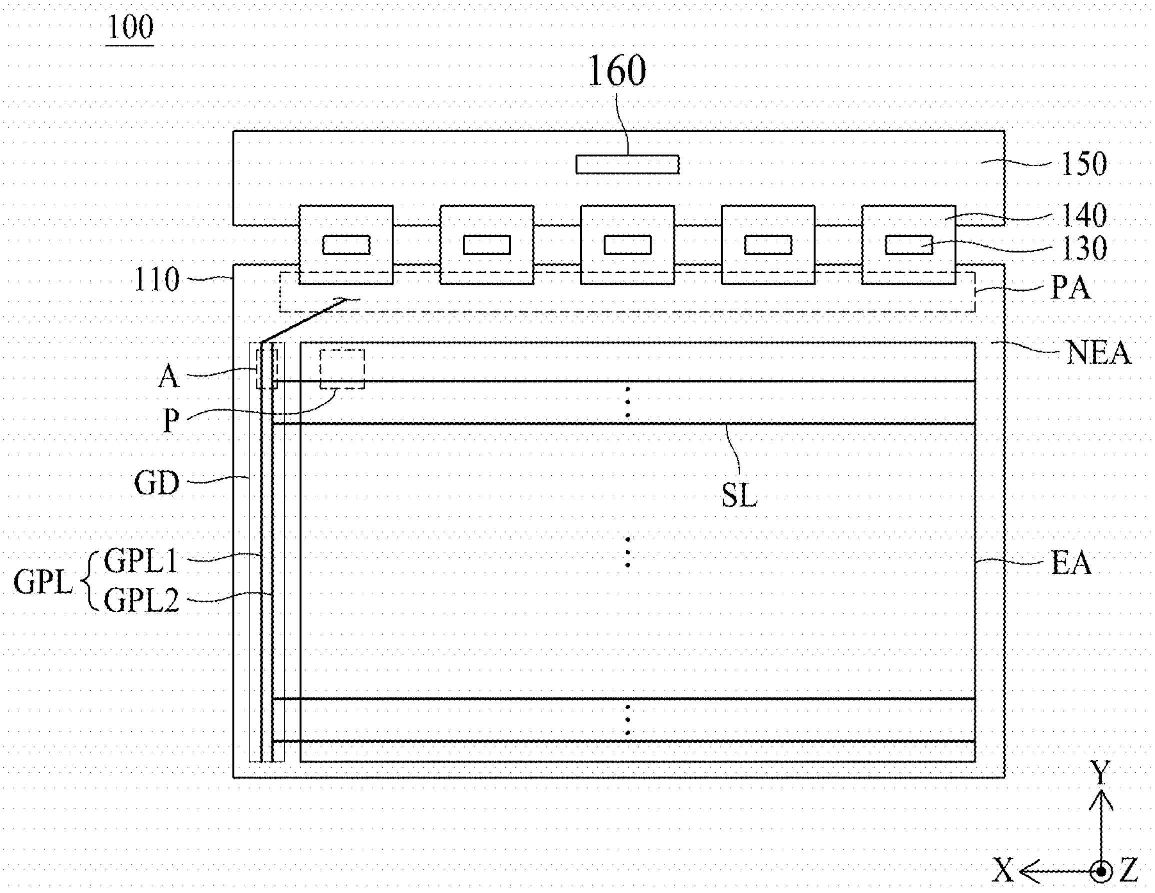
FIG. 1 is a schematic plan view illustrating a display apparatus according to an example embodiment of the present disclosure.

Reference will now be made in detail to embodiments of the present disclosure, examples of which are illustrated in the accompanying drawings. Wherever possible, the same reference numbers will be used throughout the drawings to refer to the same or like parts. Advantages and features of the present disclosure, and methods of achieving them will become apparent with reference to the example embodiments described below in detail in conjunction with the accompanying drawings. The present disclosure may, however, be embodied in different forms and should not be construed as limited to the example embodiments set forth herein. Rather, these example embodiments are provided so that this disclosure will be thorough and complete, and will fully convey the scope of the present disclosure to those skilled in the art.

The shapes, dimensions, areas, lengths, thicknesses, ratios, angles, numbers, and the like, which are illustrated in the drawings to describe various example embodiments of the present disclosure, are merely given by way of example. Therefore, the present disclosure is not limited to such illustrated details in the drawings. Like reference numerals generally denote like elements throughout the specification, unless otherwise specified.

In the following description, where a detailed description of a relevant known function or configuration may unnecessarily obscure aspects of the present disclosure, a detailed description of such a known known function or configuration may be omitted or be briefly discussed.

Where a term like "comprise," "have," "include," "contain," "constitute," "made up of," or "formed of" is used, one or more other elements may be added unless a more limiting term, such as "only" or the like, is used. An element described in the singular form is intended to include a plurality of elements, and vice versa, unless the context clearly indicates otherwise.

In construing an element, the element should be construed as including an error or tolerance range even where no explicit description of such an error or tolerance range is provided.

Where a positional relationship between two elements is described, for example, as "on," "above," "below," "beneath," and "next," or the like, one or more other elements may be located between the two elements unless a more limiting term, such as "direct(ly)," is used. For example, where a first element is described as being positioned "on" a second element, the first element may be positioned above and contact the second element or may merely be above the second element with one or more additional elements disposed between the first and second elements.

In describing a temporal relationship, where the temporal order is described as, for example, "after," "subsequent," "next," "before," "preceding," "prior to," or the like, a case that is not consecutive or not sequential may be included unless a more limiting term, such as "just," "immediate(ly)," or "direct(ly)," is used.

Although the terms "first," "second," and the like may be used herein to describe various elements, these elements should not be interpreted to be limited by these terms as they are not used to define a particular essence, order, sequence, precedence, or number of such elements. These terms are used only to distinguish one element from another. For example, a first element could be termed a second element, and a second element could similarly be termed a first element, without departing from the scope of the present disclosure.

Unless otherwise specified, such terms as "X-axis direction," "Y-axis direction," and "Z-axis direction" should not be construed only based on a geometrical relationship in which the respective directions are perpendicular to one another. Unless otherwise specified, such terms may have a broader range of directionality within which elements of the present disclosure may operate functionally.

The term "at least one" should be understood as including any and all combinations of one or more of the associated listed items. For example, the meaning of "at least one of a first item, a second item, and a third item" encompasses the combination of all three listed items, combinations of any two the first item, the second item, and the third item, as well as any individual item, the first item, the second item, or the third item.

Features of various embodiments of the present disclosure may be partially or wholly coupled to or combined with each other, and may be operated, linked, or driven together in various ways as those skilled in the art can sufficiently understand. The embodiments of the present disclosure may be carried out independently from each other, or may be carried out together in a co-dependent or related relationship.

Hereinafter, example embodiments of the present disclosure will be described in detail with reference to the accompanying drawings.

Figure 2:
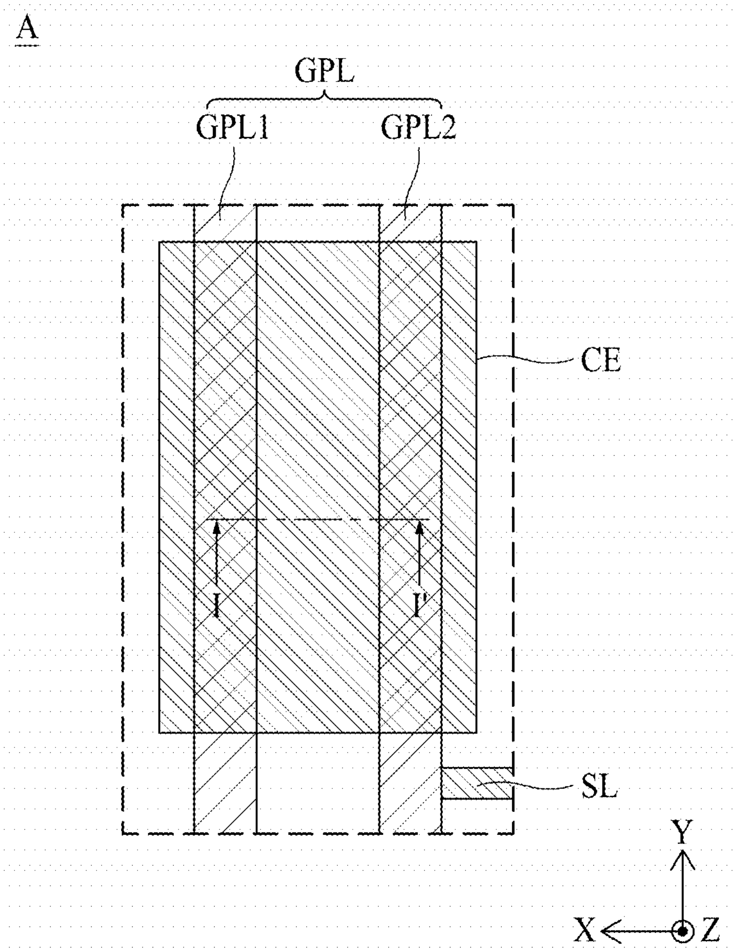
FIG. 2 is an enlarged view illustrating a portion A of FIG. 1.
Figure 3:
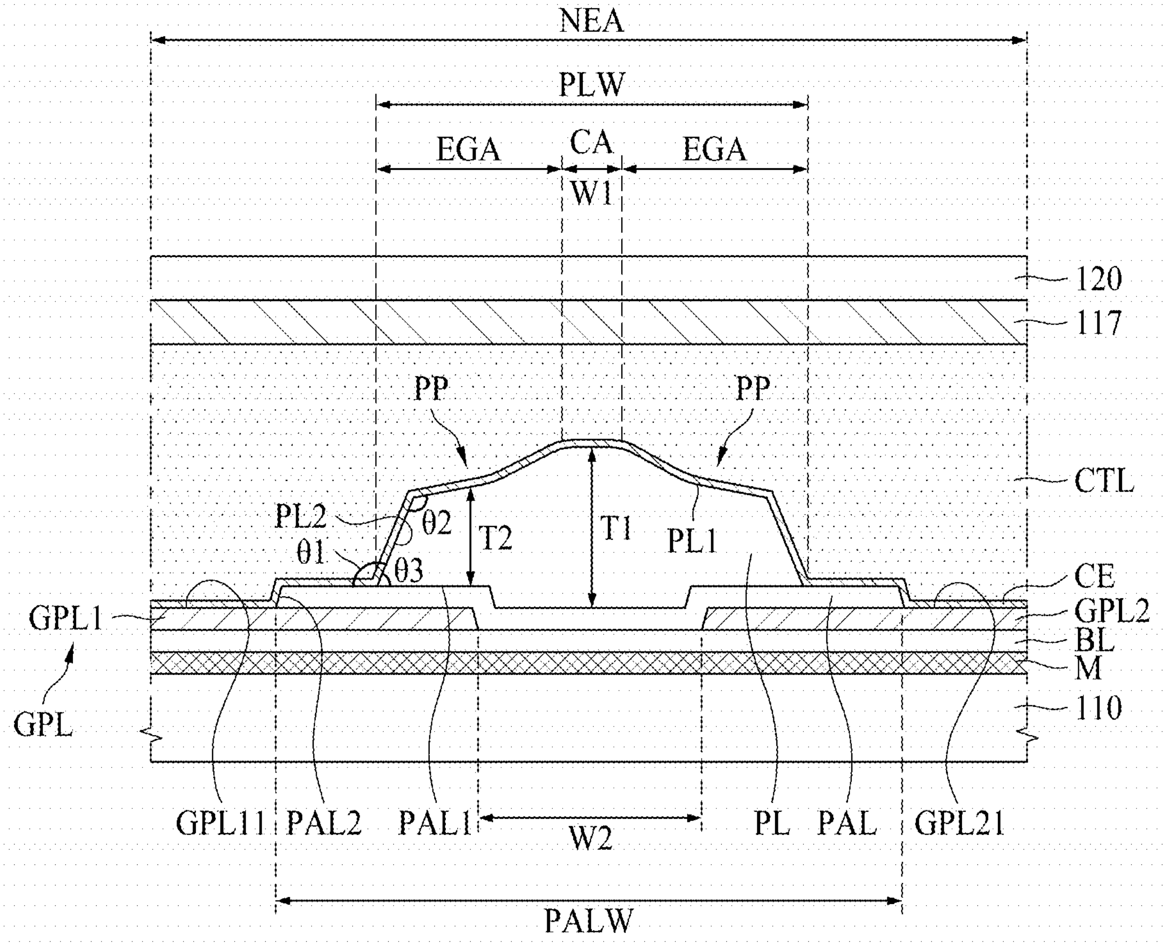
FIG. 3 is a schematic cross-sectional view along line I-I' shown in FIG. 2.
Figure 4:
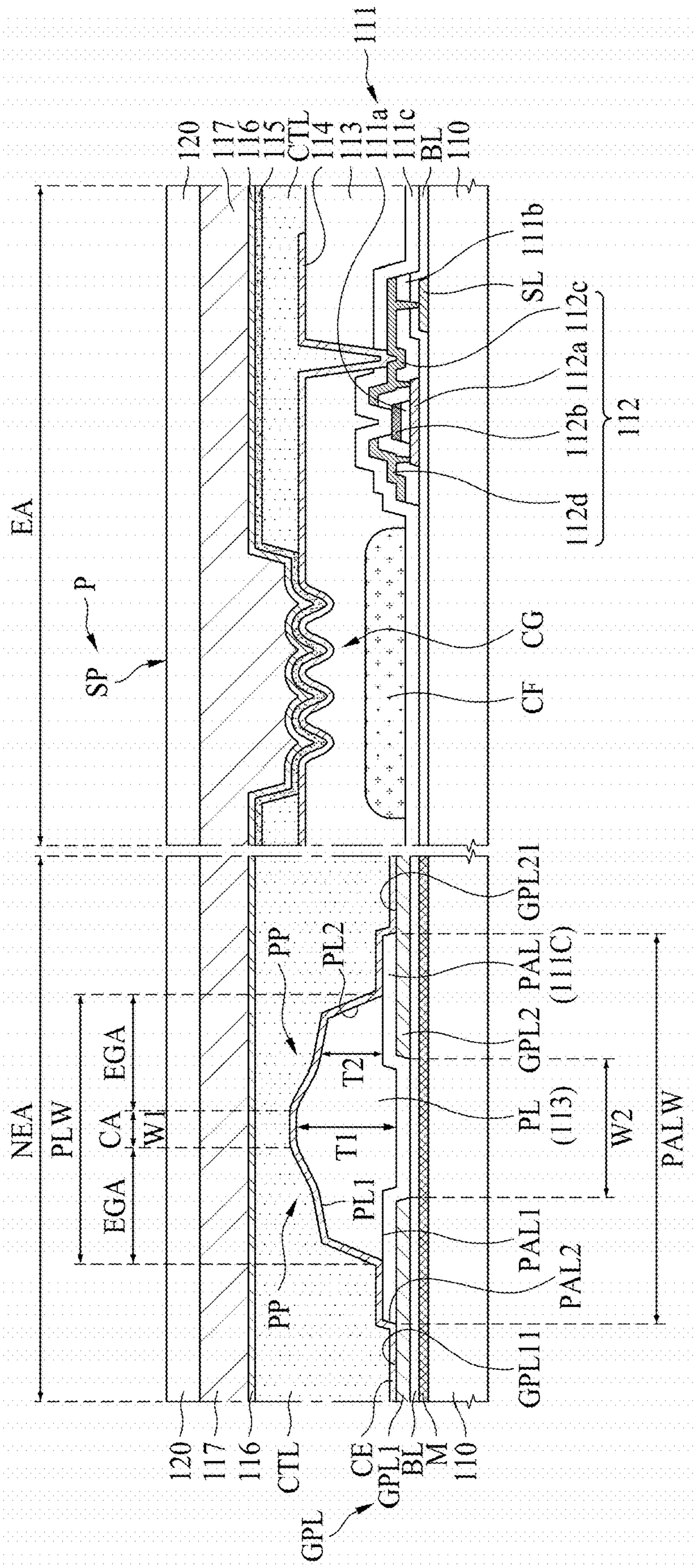
FIG. 4 is a schematic cross-sectional view illustrating a portion of each of a non-light emission area and a light emission area of a display apparatus according to an example embodiment of the present disclosure.

FIG. 1 is a schematic plan view illustrating a display apparatus according to an example embodiment of the present disclosure. FIG. 2 is an enlarged view illustrating a portion A of FIG. 1. FIG. 3 is a schematic cross-sectional view along line I-I' shown in FIG. 2. FIG. 4 is a schematic cross-sectional view illustrating a portion of each of a non-light emission area and a light emission area of a display apparatus according to an example embodiment of the present disclosure.

As shown in FIGS. 1 to 4, a display apparatus 100 according to an example embodiment of the present disclosure may include a substrate 110 having a light emission area EA and a non-light emission area NEA, a plurality of split lines GPL in the non-light emission area NEA, a planarization layer PL on the split lines GPL, and a connection electrode CE covering the planarization layer PL and contacting each of the split lines GPL.

The light emission area EA is an area from which light may be emitted, and may be referred to as a display area. The non-light emission area NEA is an area from which light is not emitted, and may be referred to as a non-display area.

Figure 8:
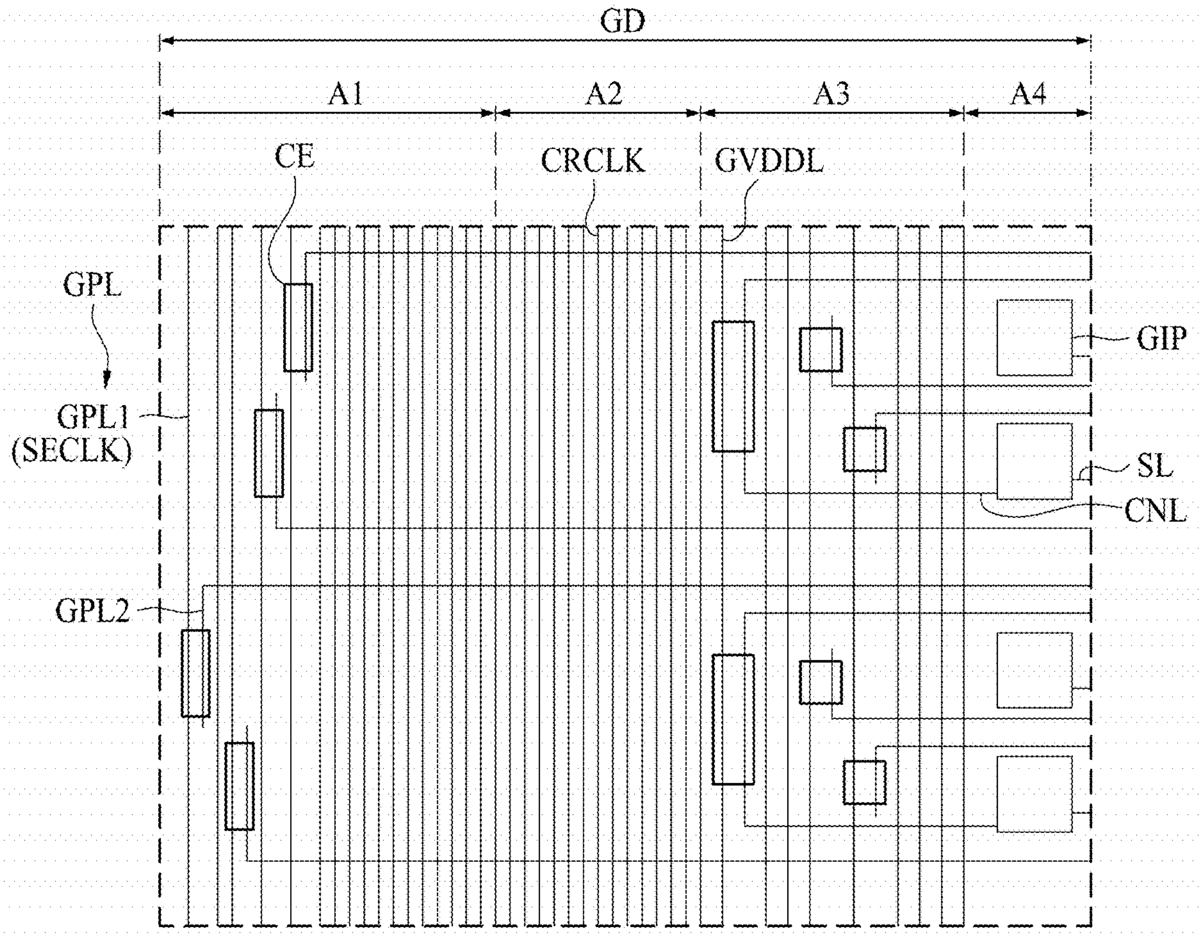
FIG. 8 is a plan view illustrating a portion of a gate driver of a display apparatus according to an example embodiment of the present disclosure.

The non-light emission area NEA may include a gate driver GD. The gate driver GD may include a plurality of Gate-In-Panel or GIP circuits (GIP, e.g., as shown in FIG. 8) for driving a plurality of pixels P in the light emission area EA, and a plurality of GIP lines connected to the plurality of GIP circuits GIP. A plurality of split lines included in the display apparatus 100 according to an example embodiment of the present disclosure may mean GIP lines disposed in the gate driver GD. Therefore, the plurality of split lines may be represented by a reference numeral of GPL.

A planarization layer may be disposed in the non-light emission area NEA and the light emission area EA. For convenience of description, the planarization layer disposed in the non-light emission area NEA (or the gate driver GD) is denoted by a reference numeral of PL, and the planarization layer disposed in the light emission area EA is denoted by a reference numeral 113.

The planarization layer PL disposed in the non-light emission area NEA (or the gate driver GD) may be disposed on the split lines GPL to overlap a portion of each of the split lines GPL. That is, the planarization layer PL disposed in the non-light emission area NEA may be disposed between the plurality of split lines GPL. Therefore, the planarization layer PL may be referred to as the planarization layer in the non-light emission area NEA (or the gate driver GD).

As shown in FIG. 3, the planarization layer PL may include a central area CA and an edge area EGA. The central area CA of the planarization layer PL may refer to a predetermined area that includes a center of each of the planarization layers PL in a horizontal direction and/or a vertical direction. The edge area EGA of the planarization layer PL may be an area in the periphery of the central area CA or an area surrounding the central area CA. For example, as shown in FIG. 3, the edge area EGA of the planarization layer PL may be an area that includes a portion of an upper surface PL1 and a side surface PL2 of the planarization layer PL. The central area CA of the planarization layer PL may be a remainder of the upper surface PL1 of the planarization layer PL except for a portion of the upper surface PL1 included in the edge area EGA. The upper surface PL1 of the planarization layer PL may refer to a surface positioned to be higher than the side surface PL2. The side surface PL2 of the planarization layer PL may refer to an inclined surface that is in contact with a passivation layer PAL (or an upper surface PAL1 of the passivation layer PAL) disposed below the planarization layer PL.

The connection electrode CE may cover the planarization layer PL and may be in contact with each of the split lines GPL (e.g., GPL1, GPL2). For example, as shown in FIG. 3, the connection electrode CE may be formed to have a width wider than an interval (or a width PLW of the planarization layer PL) of the split lines GPL spaced apart from each other, thereby covering the upper surface PL1 and the side surface PL2 of the planarization layer PL, and may be in contact with each of the split lines GPL (e.g., GPL1, GPL2) that are not covered by the planarization layer PL (or the passivation layer PAL). Thus, the connection electrode CE may electrically connect the split lines GPL, which are disposed to be spaced apart from each other, with each other. Since the connection electrode CE may cover the upper surface PL1 and the side surface PL2 of the planarization layer PL, the connection electrode CE may be formed along the profile of each of the upper surface PL1 and the side surface PL2 of the planarization layer PL.

Therefore, if the planarization layer below the connection electrode has a sharp edge shape and/or a reverse taper shape (or undercut shape) before the connection electrode is formed, a the connection electrode may be formed to have non-uniform thickness due to the sharp edge shape and/or the reverse taper shape (or undercut shape) of the planarization layer when the connection electrode is formed on the planarization layer. As a result, a deviation may occur in resistance of the connection electrode. In this case, since the split lines connected through the connection electrode may not receive a uniform current and/or voltage, lines in the light emission area, which are connected to the split lines, may be applied with a current and/or voltage that is not uniform. Therefore, a signal delay may be generated in the lines in the light emission area to cause a horizontal line defect in the display apparatus. The planarization layer (or the planarization layer of the gate driver) covering (or contacting) a portion of each of the split lines may include a sharp edge shape and/or a reverse taper shape by being indirectly affected by a process of ashing the planarization layer covering the lines in the light emission area.

To alleviate or solve such a problem, the display apparatus 100 according to an example embodiment of the present disclosure may provide a planarization layer PL that has a different thickness in the central area CA from the edge area EGA. For example, a thickness T1 of the central area CA of the planarization layer PL may be greater than a thickness T2 of the edge area EGA. The thickness T2 of the edge area EGA may refer to the thickness of the planarization layer PL at the edge of the upper surface PL1 connected to the side surface PL2 of the planarization layer PL. The edge may mean an area between the outermost portion of the upper surface PL1 of the planarization layer PL and the central area CA.

Therefore, as shown in FIG. 3, the display apparatus 100 according to an example embodiment of the present disclosure may be provided so that the planarization layer PL has a profile with a gentle slope. The fact that the slope is gentle may mean that an angle of a side surface (or an inclined surface) with respect to a horizontal surface of the planarization layer PL may be less than 90°, but is not limited thereto. Therefore, since the connection electrode CE covering the planarization layer PL may be formed along the profile of the planarization layer PL having a gentle slope, the connection electrode CE may be formed uniformly without a thickness difference on the edge area EGA and the central area CA of the planarization layer PL.

Therefore, in the display apparatus 100 according to an example embodiment of the present disclosure, since a resistance deviation of the connection electrode CE on each of the edge area EGA and the central area CA may be reduced or may not be generated, a signal delay applied to a line SL (shown, e.g., in FIG. 1) in the light emission area EA connected to the split lines GPL may be reduced or may not be generated. Therefore, the display apparatus 100 according to an example embodiment of the present disclosure may not cause a potential defect, such as horizontal line defects and/or image stains, in the light emission area EA.

For the same reason as described above, the display apparatus 100 according to an example embodiment of the present disclosure may have a structural feature in which the connection electrode CE disposed on the planarization layer PL in the non-light emission area NEA (or the gate driver GD) may be provided in a stair shape that is upwardly directed toward the central area CA of the planarization layer PL from a portion where the connection electrode CE is in contact with the split line GPL.

Hereinafter, the display apparatus 100 according to an example embodiment of the present disclosure will be described in more detail with reference to FIGS. 1 to 4.

As shown in FIGS. 1 to 4, the display apparatus 100 according to an example embodiment of the present disclosure may include a display panel including a gate driver GD, one or more source drive integrated circuits (hereinafter, referred to as "ICs") 130, one or more flexible films 140, a circuit board 150 and a timing controller 160.

The display panel may include a substrate 110 and an encapsulation substrate 120 (shown, e.g., in FIG. 4).

The substrate 110 may include a thin film transistor and may be referred to as a transistor array substrate, a lower substrate, a base substrate, or a first substrate. The substrate 110 may be a transparent glass substrate or a transparent plastic substrate.

An encapsulation substrate 120 may be formed on the substrate 110 by being deposited on an encapsulation layer 117 covering a cathode electrode 116 and/or a coating layer CTL with a smaller size than the substrate 110. The encapsulation substrate 120 may have a size smaller than that of the substrate 110 and may be formed in a portion of the substrate 110 except for a pad area PA of the substrate 110. The encapsulation substrate 120 may be referred to as an upper substrate or a second substrate.

The display apparatus 100 according to an example embodiment of the present disclosure may be provided in a bottom emission type in which light emitted from an organic light emitting layer 115 is emitted toward the substrate 110. Therefore, the encapsulation substrate 120 may include a metal material to reflect light emitted toward the encapsulation substrate 120 toward the substrate 110. Therefore, the light directed toward the encapsulation substrate 120 among the light emitted from the organic light emitting layer 115 may be reflected by the encapsulation substrate 120 and emitted through the substrate 110, whereby front light efficiency may be improved. For example, the light emitted through the substrate 110 may be light in which light emitted from the organic light emitting layer 115 and directly emitted to the substrate 110 is combined with the light reflected by the encapsulation substrate 120.

Additionally, in the display apparatus 100 according to an example embodiment of the present disclosure, since the encapsulation substrate 120 may include a metal material, a sealing function for the organic light emitting layer and a protection function for an external impact may be more improved in comparison with an example in which the encapsulation substrate does not include a metal material.

The gate driver GD may be disposed in the non-light emission area NEA adjacent to one side of the light emission area EA. The gate driver GD may be disposed in the non-light emission area NEA except for the area in which the pad area PA is disposed. That is, the gate driver GD may be disposed to be spaced apart from the pad area PA. The gate driver GD may supply gate signals to gate lines in accordance with a gate control signal input from a timing controller 160. The gate driver GD may include a plurality of GIP circuits (see, e.g., FIG. 8) and a plurality of GIP lines (or a plurality of split lines GPL) connected to the plurality of GIP circuits GIP. The plurality of GIP lines (or the plurality of split lines GPL) may be respectively connected to the plurality of GIP circuits GIP, but the present disclosure is not limited thereto. The plurality of GIP lines (or the plurality of split lines GPL) may be selectively connected to the plurality of GIP circuits GIP. Where a source drive IC 130 is manufactured as a driving chip, the source drive IC 130 may be packaged on a flexible film 140 by a chip on film (COF) method or a chip on panel (COP) method.

Pads, such as power pads and data pads, may be formed in the pad area PA of the non-light emission area of the display panel. The flexible films 140 may include lines connecting the pads with the source drive ICs 130 and lines connecting the pads with lines of a circuit board 150. The flexible films 140 may be attached onto the pads by using an anisotropic conducting film, whereby the pads may be connected to the lines of the flexible films 140.

As illustrated in FIGS. 1 and 4, the substrate 110 according to an example embodiment may include a light emission area EA and a non-light emission area NEA. The non-light emission area NEA may include a gate driver GD. The gate driver GD may include a plurality of GIP circuits GIP (see, e.g., FIG. 8) and a plurality of GIP lines (or a plurality of split lines GPL).

The light emission area EA is an area in which an image is displayed and may be referred to as a pixel array area, an active area, a display area, a pixel array unit, a display unit or a screen. For example, the light emission area EA may be disposed in a central portion of the display panel.

The light emission area EA according to an example embodiment may include gate lines, data lines, pixel driving power lines, and a plurality of pixels P. Each of the plurality of pixels P may include a plurality of subpixels SP which may be defined by corresponding gate lines and data lines.

Here, among the plurality of subpixels SP, at least four subpixels, which are provided to emit light of different colors and disposed to be adjacent to one another, may constitute one pixel P (or a unit pixel). One pixel P may include, but is not limited to, a red subpixel, a green subpixel, a blue subpixel, and a white subpixel. One pixel P may include three subpixels SP provided to emit light of different colors and disposed to be adjacent to one another. For example, one pixel P may include a red subpixel, a green subpixel, and a blue subpixel.

Each of the plurality of subpixels SP may include a thin film transistor and a light emitting element connected to the thin film transistor. The subpixel may include a light emitting layer (or an organic light emitting layer) interposed between an anode electrode and the cathode electrode.

The light emitting layer disposed in each of the plurality of subpixels SP may individually emit light of different colors or may commonly emit white light. According to an example, where the light emitting layer of each of the plurality of subpixels SP commonly emits white light, each of the red subpixel, the green subpixel, and the blue subpixel may include a color filter CF (or a wavelength conversion member CF) for converting the white light into light of different colors. In this case, the white subpixel according to the example may not include a color filter.

In the transparent display apparatus 100 according to an example embodiment of the present disclosure, an area in which a red color filter is provided may be a red subpixel or a first subpixel, an area in which a green color filter is provided may be a green subpixel or a second subpixel, an area in which a blue color filter is provided may be a blue subpixel or a third subpixel, and an area in which a color filter is not provided may be a white subpixel or a fourth subpixel.

Each of the subpixels SP may supply a predetermined current to the organic light emitting element via the thin film transistor in accordance with a data voltage of the data line when a gate signal is input from the gate line. For this reason, the light emitting layer of each of the subpixels may emit light with a predetermined brightness in accordance with the predetermined current.

The plurality of subpixels SP according to an example may be disposed to be adjacent to each other in a first direction. The first direction may be a horizontal direction or the X-direction based on FIG. 1. The horizontal direction may be a direction in which the line SL in the light emission area EA of the display apparatus 100 is disposed. For example, the line SL may be any one of a gate line, a pixel power line, a signal start line, a reset line, and a ground line. Since most of the lines are disposed in the light emission area EA, the line may be referred to as a light emission area line.

According to an example embodiment of the present disclosure, the light emission area line SL may be connected to any one of the plurality of split lines GPL in the non-light emission area NEA (or the gate driver GD). Therefore, the light emission area line SL may receive a voltage and/or signal for driving the light emission area EA from the split line GPL. For example, as shown in FIG. 2, one side of the light emission area line SL may be connected to the split line GPL (or a second split line GPL2). The other side of the light emission area line SL may be disposed between the substrate 110 and the buffer layer BL in the light emission area EA, as shown in FIG. 4, and thus may be connected to a thin film transistor 112 through a contact hole.

The plurality of split lines GPL according to an example may be disposed in the non-light emission area NEA (or the gate driver GD). For example, as shown in FIG. 1, the plurality of split lines GPL may be disposed in a second direction crossing the first direction. The second direction may be a vertical direction or the Y-direction based on FIG. 1, and the vertical direction may be a direction parallel with the data line. Although only two split lines GPL (GPL1 and GPL2) are shown in FIG. 1, this is merely for convenience of description, and three or more split lines may be disposed in the non-light emission area NEA (or the gate driver GD).

The non-light emission area NEA is an area in which an image is not displayed, and may be referred to as a peripheral circuit area, a signal supply area, a non-active area, or a bezel area. The non-light emission area NEA may be configured to be adjacent to the light emission area EA. That is, the non-light emission area NEA may be disposed to surround the light emission area EA. The non-light emission area NEA may include a gate driver GD, and the gate driver GD may include a plurality of GIP circuits GIP and a plurality of split lines GPL.

In the display apparatus 100 according to an example embodiment of the present disclosure, the pad area PA may be disposed in the non-light emission area NEA. The pad area PA may supply a power source and/or signal in order for the pixel(s) P provided in the light emission area EA to output an image. The pad area PA may be provided on an upper side of the light emission area EA based on FIG. 1.

The gate driver GD may supply the gate signals to the gate lines in accordance with the gate control signal input from the timing controller 160. The gate driver GD may be formed at one side of the light emission area EA or in the non-light emission area NEA adjacent to a left side of the light emission area EA in a gate driver in panel (GIP) mode as shown in FIG. 1.

The plurality of split lines GPL may be disposed in the plurality of gate drivers GD. The plurality of split lines GPL are intended to prevent a thin film transistor of a pixel from being damaged as static electricity generated during a manufacturing process of the display apparatus may be applied to the line(s) in the light emission area. For example, the plurality of split lines GPL may generate static electricity by a contact with another object during the manufacturing process of the display apparatus. Where a line in the non-light emission area is only a single line without being split, static electricity may be applied to the thin film transistor of the pixel through the line and a light emission area line connected to the line. In this case, a problem, such as bursting of the thin film transistor, may occur due to static electricity.

Therefore, in the display apparatus 100 according to an example embodiment of the present disclosure, a line disposed in the non-light emission area NEA (or the gate driver GD) may be split into the plurality of split lines GPL, and the split lines GPL formed (or disposed) by splitting a line in the last step (or the latter process) of the manufacturing process may be connected to each other through the connection electrode CE, whereby static electricity generated before the connection electrode CE is formed may be prevented from being applied to the thin film transistor.

The split lines GPL according to an example may include a first split line GPL1 and a second split line GPL2. The first split line GPL1 may be a line disposed in the gate driver GD and extended to reach the pad area PA and be connected to the pad area PA. Therefore, as shown in FIG. 1, a portion of the first split line GPL1 may be directly connected to the pad area PA in the non-light emission area NEA by extending beyond the gate driver GD. The other portion of the first split line GPL1 may be disposed to extend in the second direction in the gate driver GD. In another example, the first split line GPL1 may be connected to a metal line M (shown, e.g., in FIG. 3) between the substrate 110 and the buffer layer BL through the contact hole (not shown), thereby being indirectly connected to the pad area PA. In this case, the metal line M may be directly connected to the pad area PA.

The second split line GPL2 may be disposed in the gate driver GD. The second split line GPL2 may be electrically connected to the first split line GPL1 through the connection electrode CE. In detail, as shown in FIG. 1, the second split line GPL2 may be disposed only in the gate driver GD, and as shown in FIG. 3, may be connected to the first split line GPL1 through the connection electrode CE. Therefore, the second split line GPL2 may be indirectly connected to the pad area PA through the connection electrode CE and the first split line GPL1 without being directly connected to the pad area PA. The second split line GPL2 may receive a signal and/or voltage from the pad area PA through the connection electrode CE and the first split line GPL1. The first split line GPL1 and the second split line GPL2, which are disposed in the gate driver GD, may be spaced apart from each other in the first direction and may be disposed to extend in the second direction.

The second split line GPL2 may be connected to the light emission area line SL in the light emission area EA. Therefore, the second split line GPL2 may apply the signal and/or voltage from the pad area PA applied via the first split line GPL1 to the line in the light emission area, that is, the light emission area line SL.

The second split line GPL2 may be provided on the same layer through the same process as that of the light emission area line SL and thus may be electrically connected to the light emission area line SL, but is not limited thereto. The second split line GPL2 may be disposed on a different layer from the light emission area line SL through another process. In this case, the second split line GPL2 and the light emission area line SL may be electrically connected to each other through a contact hole.

The plurality of subpixels SP may be provided to overlap at least one of the plurality of light emission area lines SL in the light emission area EA to emit predetermined light, thereby displaying an image.

As shown in FIG. 4, the display apparatus 100 according to an example embodiment of the present disclosure may further include a buffer layer BL, a circuit element layer 111, a thin film transistor 112, an anode electrode 114, a coating layer CTL, an organic light emitting layer 115, a cathode electrode 116, and a color filter CF.

In more detail, each of the subpixels SP according to an example embodiment may include a circuit element layer 111 (including a gate insulating layer 111*a*, an interlayer insulating layer 111*b*, and a passivation layer 111*c*) provided on an upper surface of the buffer layer BL, a planarization layer 113 provided on the circuit element layer 111, an anode electrode 114 provided on the planarization layer 113, a coating layer CTL covering an edge of the anode electrode 114, an organic light emitting layer 115 on the anode electrode 114 and the coating layer CTL, a cathode electrode 116 on the organic light emitting layer 115, and an encapsulation layer 117 on the cathode electrode 116.

The thin film transistor 112 for driving the subpixel SP may be disposed in the circuit element layer 111. The circuit element layer 111 may also be referred to as an inorganic layer. The buffer layer BL may be included in the circuit element layer 111 together with the gate insulating layer 111*a*, the interlayer insulating layer 111*b*, and the passivation layer 111*c*. The anode electrode 114, the organic light emitting layer 115, and the cathode electrode 116 may be included in a light emitting element.

As shown in FIG. 4, the buffer layer BL may be formed between the substrate 110 and the gate insulating layer 111*a* to protect the thin film transistor 112. The buffer layer BL may be disposed entirely on one surface (or a front or upper surface) of the substrate 110. The buffer layer BL may serve to prevent a material contained in the substrate 110 from being diffused into a transistor layer during a high temperature process of the manufacturing process of the thin film transistor. Optionally, the buffer layer BL may be omitted as the case may be.

The thin film transistor (or a drive transistor) 112 according to an example may include an active layer 112*a*, a gate electrode 112*b*, a source electrode 112*c*, and a drain electrode 112*d*.

The active layer 112*a* may include a channel area, a drain area, and a source area, which are formed in a thin film transistor area of a circuit area of the subpixel SP. The drain area and the source area may be spaced apart from each other with the channel area interposed therebetween.

The active layer 112*a* may be formed of a semiconductor material based on any one of amorphous silicon, polycrystalline silicon, oxide, and organic material.

The gate insulating layer 111*a* may be formed on the channel area of the active layer 112*a*. As an example, the gate insulating layer 111*a* may be formed in an island shape only on the channel area of the active layer 112*a*, or may be formed on an entire front surface of the substrate 110 or the buffer layer BL, which includes the active layer 112*a*.

The gate electrode 112*b* may be formed on the gate insulating layer 111*a* to overlap the channel area of the active layer 112*a*.

The interlayer insulating layer 111*b* may be formed on the gate electrode 112*b* and a drain area and a source area of the active layer 112*a* to partially overlap them. As shown in FIG. 4, the interlayer insulating layer 111*b* may be patterned among the gate electrode 112*b*, the drain area of the active layer 112*a*, and the drain electrode 112*d* and disposed in an island shape, and may also be patterned among the gate electrode 112*b*, the source area of the active layer 112*a*, and the source electrode 112*c* and disposed in another island shape. However, the present disclosure is not limited thereto. The interlayer insulating layer 111*b* may be formed in the circuit area and the entire light emission area in which light is emitted to the subpixel SP.

The source electrode 112*c* may be electrically connected to the source area of the active layer 112*a* through a source contact hole provided in the interlayer insulating layer 111*b* that overlaps the source area of the active layer 112*a*. The source electrode 112*c* may be connected to the light emission area line SL disposed between the substrate 110 and the buffer layer BL. Therefore, the source electrode 112*c* may receive a driving voltage or an image signal from the light emission area line SL to allow the subpixel SP to emit light.

The drain electrode 112*d* may be electrically connected to the drain area of the active layer 112*a* through a drain contact hole provided in the interlayer insulating layer 111*b* overlapping with the drain area of the active layer 112*a*.

The drain electrode 112*d* and the source electrode 112*c* may be made of the same metal material. For example, each of the drain electrode 112*d* and the source electrode 112*c* may be made of a single metal layer, a single layer of an alloy, or a multi-layer of two or more layers, which may be the same as or different from that of the gate electrode.

In addition, the circuit area may further include first and second switching thin film transistors, disposed together with the thin film transistor 112, and a capacitor. Since each of the first and second switching thin film transistors may be provided on the circuit area of the subpixel SP to have the same structure as that of the thin film transistor 112, its description will be omitted. The capacitor (not shown) may be provided in an area of overlap between the gate electrode 112*b* and the source electrode 112*c* of the thin film transistor 112, which overlap each other with the interlayer insulating layer 111*b* interposed therebetween.

Additionally, in order to prevent a threshold voltage of the thin film transistor provided in a pixel area from being shifted by light, the display panel or the substrate 110 may further include a light shielding layer (not shown) provided below the active layer 112*a* of at least one of the thin film transistor 112, the first switching thin film transistor, and the second switching thin film transistor. The light shielding layer may be disposed between the substrate 110 and the active layer 112*a* to shield the active layer 112*a* from external light through the substrate 110, thereby minimizing a change in the threshold voltage of the transistor due to external light. Also, where the light shielding layer is provided between the substrate 110 and the active layer 112*a*, the thin film transistor may be prevented from being seen by a user.

The passivation layer 111*c* may be provided on the substrate 110 to cover the pixel area. The passivation layer 111*c* may cover the drain electrode 112*d*, the source electrode 112*c*, the gate electrode 112*b*, and the buffer layer BL of the thin film transistor 112. The passivation layer 111*c* may be formed in the entire circuit area and the entire light emission area. Alternatively, the passivation layer 111*c* may be omitted.

Also, in the display apparatus 100 according to an example embodiment of the present disclosure, the passivation layer may be represented by a reference numeral of 111*c* in the light emission area EA and may be represented by a reference numeral of PAL in the non-light emission area NEA (or the gate driver GD). Therefore, the passivation layer 111*c* in the light emission area EA and the passivation layer PAL in the non-light emission area NEA (or the gate driver GD) may only differ from each other in reference numerals and may be formed on the same layer with substantially the same material.

The planarization layer 113 may be formed on the substrate 110 to cover the passivation layer 111*c* and the color filter CF. Where the passivation layer 111*c* is omitted, the planarization layer 113 may be provided on the first substrate 110 to cover the circuit area. The planarization layer 113 may be formed in the entire circuit area where the thin film transistor 112 is disposed and the light emission area EA. In addition, the planarization layer 113 may be formed on a portion of the non-light emission area NEA except the pad area PA and on the entire light emission area EA. For example, the planarization layer 113 may include an extension portion (or enlarged portion) extended or enlarged from the light emission area EA to the non-light emission area NEA except the pad area PA. Therefore, the planarization layer 113 may have a planar size relatively wider than that of the light emission area EA.

The planarization layer 113 according to an example may be formed to be relatively thick, and thus may provide a flat surface on the light emission area EA and the non-light emission area NEA. For example, the planarization layer 113 may be made of an organic material such as photo acryl, benzocyclobutene, polyimide, and fluorine resin.

For convenience of description, the planarization layer may be represented by a reference numeral 113 in the light emission area EA and may be represented by a reference numeral of PL in the non-light emission area NEA. Therefore, the planarization layer 113 in the light emission area EA and the planarization layer PL in the non-light emission area NEA may only differ from each other in reference numerals and may be formed on the same layer with substantially the same material.

The planarization layer 113 formed in the light emission area EA may include a plurality of concave grooves CG. The plurality of concave grooves CG may be configured to increase light efficiency of the light emission area EA and may be formed in the planarization layer 113. As shown in FIG. 4, the plurality of concave grooves CG may be provided to be connected to each other so that an embossed shape may be formed in the planarization layer 113. Since the anode electrode 114 is formed on the concave grooves CG, the anode electrode 114 may also be provided in an embossing shape, and the organic light emitting layer 115 and the cathode electrode 116, which are formed on the anode electrode 114, may also be provided in an embossed shape. Therefore, among the light emitted from the organic light emitting layer 115, the light directed toward the side may be reflected in or by the anode electrode 114 and/or the cathode electrode 116 in the embossed shape and then be directed toward the substrate 110, whereby light efficiency may be improved. As described above, since light efficiency may be improved due to the plurality of concave grooves CG, the plurality of concave grooves CG may be referred to as a light efficiency enhancing structure.

After the planarization layer 113 is deposited to cover the passivation layer 111*c* and the color filter CF, the plurality of concave grooves CG may be formed in the planarization layer 113 through a photo process using a mask provided with an opening and a patterning (or etching) or ashing process after the photo process. The plurality of concave grooves CG may be formed in an area overlapping with the color filter CF and/or an area that does not overlap with the coating layer CTL in the light emission area EA. The plurality of concave grooves CG may be simultaneously formed through the same process as that of a pattern portion PP of the planarization layer PL in the non-light emission area NEA. Therefore, the plurality of concave grooves CG and the pattern portion PP may be formed on the same layer. For example, the plurality of concave grooves CG may be formed in the planarization layer 113 (or the upper surface of the planarization layer 113) in the light emission area EA, and the pattern portion PP may be formed in the planarization layer PL (or the upper surface of the planarization layer PL) in the non-light emission area NEA.

After the planarization layer PL is deposited on the passivation layer PAL in the non-light emission area NEA (or the gate driver GD), the planarization layer PL is patterned by a pattern material, and the pattern portion PP may be formed in the planarization layer PL, for example, through a mask having a slit portion, a photo process using a photoresist, and an ashing process. The slit portion of the mask positioned in the non-light emission area NEA (or the gate driver GD) to form the pattern portion PP may be disposed in the periphery of the central area CA of the planarization layer PL. That is, the slit portion of the mask positioned in the non-light emission area NEA (or the gate driver GD) to form the pattern portion PP may be disposed in the edge area EGA of the planarization layer PL. Therefore, the pattern portion PP may be formed in the edge area EGA outside the central area CA of the planarization layer PL through the photo process and the ashing process. Therefore, the edge area EGA of the planarization layer PL may include the pattern portion PP. As shown in FIG. 3, the central area CA of the planarization layer PL may be defined as an area that excludes the pattern portion PP from the upper surface PL1 of the planarization layer PL.

As shown in FIG. 4, the pattern portion PP may be formed only on a portion of the edge area EGA or the upper surface PL1 of the planarization layer PL, but is not limited thereto. The pattern portion PP may be formed in the entire edge area EGA in accordance with a photo process time and/or intensity of light. However, even in this case, the pattern portion PP may be provided to have a gentle slope.

Also as shown in FIG. 4, the color filter CF disposed in the light emission area EA may be provided between the substrate 110 and the planarization layer 113. The color filter may include a red color filter (or a first color filter) for converting white light emitted by the organic light emitting layer 115 into red light, a green color filter (or a second color filter) for converting white light into green light, and a blue color filter (or a third color filter) for converting white light into blue light. A fourth subpixel, which is a white subpixel, may not include a color filter because the organic light emitting layer 115 in this example emits white light.

Although not shown, the display apparatus 100 according to an example embodiment of the present disclosure may be provided such that color filters having different colors partially overlap one another at a boundary portion of the plurality of subpixels SP. In this case, in the display apparatus 100 according to an example embodiment of the present disclosure, since light emitted from each subpixel SP may be prevented from being emitted to an adjacent subpixel SP due to the color filters partially overlapping with each other at the boundary portion of the subpixel SP, color mixture between the subpixels SP may be prevented from occurring.

The anode electrode 114 of the subpixel SP may be formed on the planarization layer 113. The anode electrode 114 may be connected to a drain electrode or a source electrode of the thin film transistor 112 through a contact hole that passes through the planarization layer 113 and the passivation layer 111*c*. The anode electrode 114 may be provided to be wider than the plurality of concave grooves CG so that an edge portion of the anode electrode 114 may be covered by the coating layer CTL. The anode electrode 114 may be formed of at least one of a transparent metal material, a semi-transmissive metal material, and a metal material having high reflectance.

Since the display apparatus 100 according to an example embodiment of the present disclosure is of a bottom emission type, the anode electrode 114 may be formed of a transparent conductive material (TCO), such as ITO and IZO, which may transmit light, or a semi-transmissive conductive material, such as magnesium (Mg), silver (Ag) or an alloy of magnesium (Mg) and silver (Ag).

Also, the material constituting the anode electrode 114 may include MoTi. The anode electrode 114 may be referred to as the first electrode or a pixel electrode.

The coating layer CTL may be provided in an area from which light is not emitted, and may be provided to surround each of light emitting portions (or the concave grooves CG) in each of the plurality of subpixels SP. That is, the coating layer CTL may partition (or define) an area with the concave grooves CG in each of the light emitting portions or the subpixels SP. The light emitting portion may refer to a portion in which the organic light emitting layer is interposed between an anode electrode and a cathode electrode and in which the anode electrode and the cathode electrode are respectively in contact with an upper surface and a lower surface of the organic light emitting layer.

The coating layer CTL may be formed to cover an edge of the anode electrode 114 in each of the subpixels SP and may expose a portion of each of the anode electrodes 114. That is, the coating layer CTL may partially cover the anode electrode 114. Therefore, the coating layer CTL may prevent light emission efficiency from being deteriorated due to a current concentrated on each end of the anode electrode 114. An exposed portion of the anode electrode 114, which is not covered by the coating layer CTL, may be included in the light emitting portion. Since the light emitting portion may be formed on the plurality of concave grooves CG as shown in FIG. 4, the light emitting portion may overlap the concave grooves CG in a thickness direction of the substrate 110.

After the coating layer CTL is formed, the organic light emitting layer 115 may be formed to cover the anode electrode 114 and the coating layer CTL. Therefore, the coating layer CTL may be provided between the anode electrode 114 and the organic light emitting layer 115. The coating layer CTL may be referred to as a pixel defining layer or a bank. The coating layer CTL according to an example may include an organic material. Where the coating layer CTL is made of an organic material, as shown in FIG. 4, the coating layer CTL in the non-light emission area NEA may have a thickness different from that of the coating layer CTL in the light emission area EA. In addition, where the coating layer CTL is made of an organic material, since an upper surface of the coating layer CTL may be provided to be flat, the organic light emitting layer 115, the cathode electrode 116 and the encapsulation layer 117, which are formed on the upper surface of the coating layer CTL, may also be provided to be flat in a subsequent process.

The coating layer CTL in the non-light emission area NEA (or the gate driver GD) may be provided to cover the connection electrode CE as shown in FIG. 4. The connection electrode CE may respectively cover the planarization layer PL, a portion of the passivation layer PAL which is not covered by the planarization layer PL, and a portion of the plurality of split lines GPL which are not covered by the passivation layer PAL. As shown in FIG. 4, the cathode electrode 116 may be formed to be extended to the non-light emission area NEA (or the gate driver GD), and thus may be disposed between the coating layer CTL and the encapsulation substrate 120.

Also as illustrated in FIG. 4, the organic light emitting layer 115 may be formed on the anode electrode 114 and the coating layer CTL in the light emission area EA. Since the organic light emitting layer 115 is provided between the anode electrode 114 and the cathode electrode 116, when a voltage is applied to each of the anode electrode 114 and the cathode electrode 116, holes and electrons may move to the organic light emitting layer 115, respectively. The holes and electrons moved to the organic light emitting layer 115 may be combined with each other in the organic light emitting layer 115 to emit light. The organic light emitting layer 115 may be formed as a common layer provided on the coating layer CTL in the plurality of subpixels SP.

The organic light emitting layer 115 according to an example embodiment may be provided to emit white light. The organic light emitting layer 115 may include a plurality of stacks which are configured to emit lights of different colors. For example, the organic light emitting layer 115 may include a first stack, a second stack, and a charge generating layer (CGL) provided between the first stack and the second stack. The organic light emitting layer 115 may be provided to emit white light, and thus, each of the plurality of subpixels SP may include a color filter CF suitable for a corresponding color.

The first stack may be provided on the anode electrode 114 and may be implemented with a structure where a hole injection layer (HIL), a hole transport layer (HTL), an emission layer (EML(B)), and an electron transport layer (ETL) are sequentially stacked.

The charge generating layer may supply an electric charge to the first stack and the second stack. The charge generating layer may include an N-type charge generating layer for supplying an electron to the first stack and a P-type charge generating layer for supplying a hole to the second stack. The N-type charge generating layer may include a metal material as a dopant.

The second stack may be provided on the first stack and may be implemented in a structure where a hole transport layer (HTL), a yellow-green (YG) emission layer (EML (YG)), and an electron injection layer (EIL) are sequentially stacked.

In the display apparatus 100 according to an example embodiment of the present disclosure, because the organic light emitting layer 115 is provided as a common layer, the first stack, the charge generating layer, and the second stack may be arranged over all the plurality of subpixels SP.

According to another example embodiment, the organic light emitting layer 115 may be provided to emit lights of different colors and may be patterned in each of the plurality of subpixels SP. However, in this case, a hole injection layer (HIL), a hole transport layer (HTL), an emission transport layer (ETL), and an electron injection layer (EIL), but not an emission layer, may be arranged as a common layer in the subpixels SP. Also, in an example where the organic light emitting layer 115 is patterned in each of the subpixels SP, a color filter may not be provided between the substrate 110 and the organic light emitting layer 115.

The cathode electrode 116 may be formed on the organic light emitting layer 115. The cathode electrode 116 according to an example example may include a metal material. The cathode electrode 116 may reflect light emitted from the organic light emitting layer 115 in the plurality of subpixels SP toward the lower surface of the substrate 110. Therefore, the display apparatus 100 according to an example embodiment of the present disclosure may be implemented as a bottom emission type display apparatus.

The display apparatus 100 according to an example embodiment of the present disclosure may a bottom emission type and may reflect light emitted from the organic light emitting layer 115 toward the substrate 110. Thus, the cathode electrode 116 may be made of a metal material having high reflectance. The cathode electrode 116 according to an example may be formed of a metal material having high reflectance, such as a stacked structure (Ti/Al/Ti) of aluminum (Al) and titanium (Ti), a stacked structure (ITO/Al/ITO) of aluminum (Al) and ITO, Ag alloy, or a stacked structure (ITO/Ag alloy/ITO) of Ag alloy and ITO. The Ag alloy may be an alloy of silver (Ag), palladium (Pd), copper (Cu), etc. The cathode electrode 116 may be referred to as a second electrode or a counter electrode.

The encapsulation layer 117 may be formed on the cathode electrode 116. The encapsulation layer 117 may prevent water or oxygen from penetrating into the organic light emitting layer 115 and the cathode electrode 116. To this end, the encapsulation layer 117 may include at least one inorganic layer and at least one organic layer.

As shown in FIG. 4, the encapsulation layer 117 may be disposed not only in the light emission area EA but also in the non-light emission area NEA. The encapsulation layer 117 disposed in the non-light emission area NEA may be disposed between the coating layer CTL and the encapsulation substrate 120. The encapsulation layer 117 may be formed on the coating layer CTL covering the planarization layer PL to contact the upper surface of the coating layer CTL in the non-light emission area NEA. Since the coating layer CTL in the non-light emission area NEA may be made of an organic material, an upper surface corresponding to each of the central area CA and the edge area EGA of the planarization layer PL may be provided to be flat. Therefore, a lower surface of the encapsulation layer 117, which may be in contact with the upper surface of the coating layer CTL provided to be flat, may also be provided to be flat.

As a result, the light emission area EA may include a planarization layer 113 on the same layer as the planarization layer PL in the non-light emission area NEA, an anode electrode 114 on the planarization layer 113 in the light emission area EA, a coating layer CTL covering the edge of the anode electrode 114, an organic emission layer 115 on the coating layer CTL and the anode electrode 114, a cathode electrode 116 on the organic emission layer 115, and an encapsulation layer 117 on the cathode electrode 116.

The coating layer CTL and/or the encapsulation layer 117 in the non-light emission area NEA may be formed to be extended to or from the light emission area EA. Therefore, the coating layer CTL extended to the light emission area EA may cover the edge of the anode electrode 114. The encapsulation layer 117 extended to the light emission area EA may be disposed on the cathode electrode 116.

However, one or both of the organic light emitting layer 115 and the cathode electrode 116 may be formed only in the light emission area EA and may not be formed in the non-light emission area NEA. Therefore, the encapsulation layer 117 in the non-light emission area NEA may be disposed directly on the upper surface of the coating layer CTL, and the encapsulation layer 117 in the light emission area EA may be disposed on the upper surface of the cathode electrode 116, but the present disclosure is not limited thereto. The organic light emitting layer 115 and the cathode electrode 116 may also be formed in the non-light emission area NEA in order to reduce a difference in visibility from the light emission area EA. However, in this case, the organic light emitting layer 115 formed in the non-light emission area NEA may be provided in a disconnected shape (or discontinuous shape) so that moisture permeation from the outside through the light emitting layer 115 may be avoided.

Figure 5A:
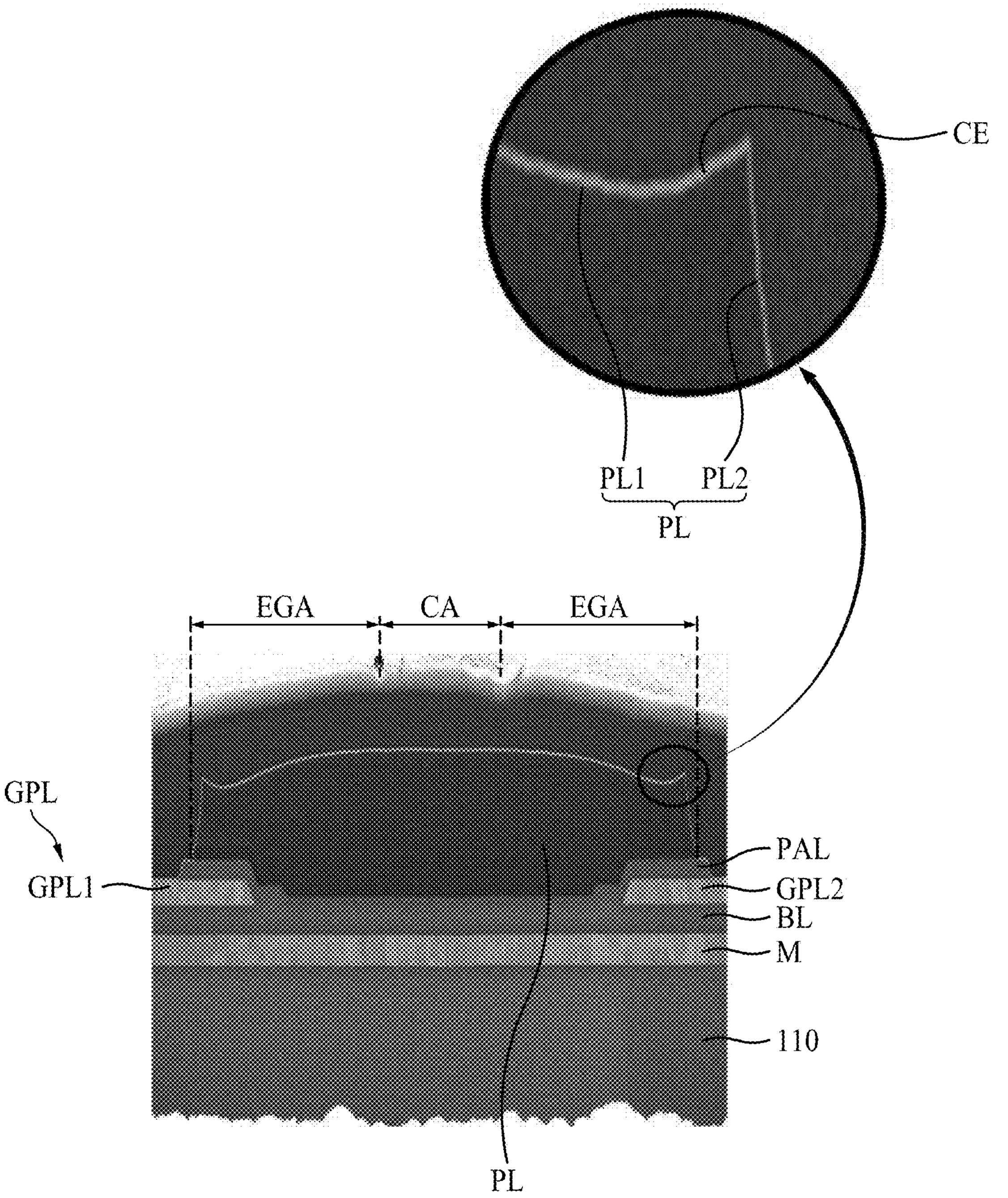
FIG. 5A is a view illustrating a thickness of a connection electrode at a side surface and an upper surface of a planarization layer in a comparative example in which a planarization layer has a sharp edge shape.
Figure 5B:
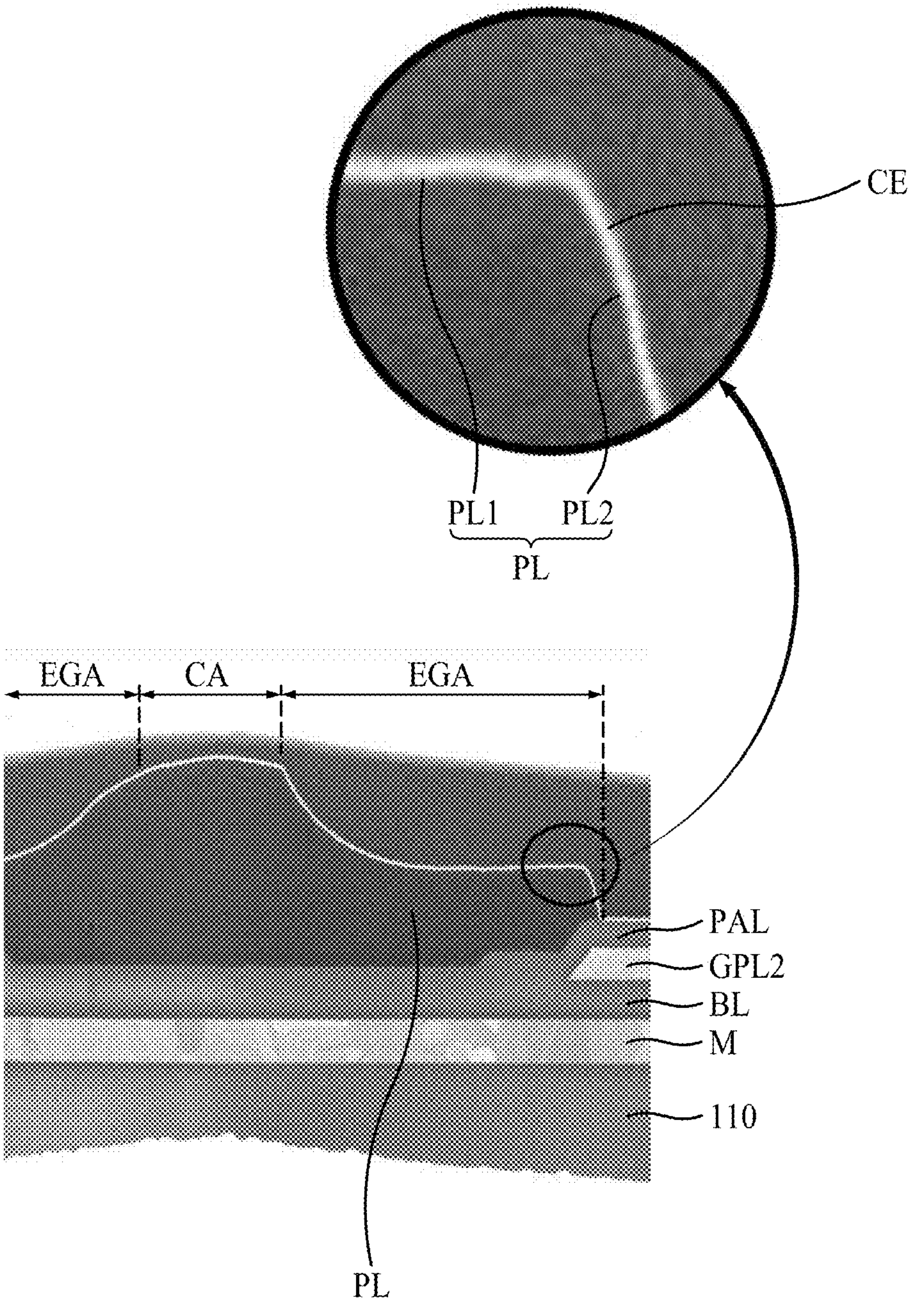
FIG. 5B is a view illustrating a thickness of a connection electrode on a side surface and an upper surface of a planarization layer in a display apparatus according to an example embodiment of the present disclosure.

FIG. 5A is a view illustrating a thickness of a connection electrode at a side surface and an upper surface of a planarization layer in a comparative example in which the planarization layer has a sharp edge shape. FIG. 5B is a view illustrating a thickness of a connection electrode at a side surface and an upper surface of a planarization layer in a display apparatus according to an example embodiment of the present disclosure.

Hereinafter, the non-light emission area NEA (or the gate driver GD) of the display apparatus 100 according to an example embodiment of the present disclosure will be described in more detail with reference to FIGS. 1 to 5B.

The display apparatus 100 according to an example embodiment of the present disclosure is provided with a plurality of split lines GPL outside of the substrate 110, that is, in the gate driver GD in the non-light emission area NEA, in order to prevent the thin film transistor 112 from being damaged from static electricity generated during a manufacturing process. For example, the plurality of split lines GPL may include a first split line GPL1 connected to a pad area PA and a second split line GPL2 connected to a light emission area line SL. The first split line GPL1 and the second split line GPL2 may be disposed to be spaced apart from each other in the first direction in the non-light emission area NEA (or the gate driver GD) and may be electrically connected to each other through the connection electrode CE covering the planarization layer PL in the last step of the manufacturing process.

As described above, where the planarization layer includes a sharp edge shape and/or a reverse taper shape, the thickness of the connection electrode covering the planarization layer is not uniformly formed. Thus, a signal delay due to a resistance deviation may be generated, whereby a horizontal line defect may occur.

According to the comparative example of FIG. 5A, the planarization layer in the non-display area includes a sharp edge shape and/or a reverse taper shape because the planarization layer in the non-light emission area is indirectly affected by the ashing process of forming a light efficiency enhancing structure such as a plurality of concave grooves in the planarization layer in the light emission area. For example, as shown in FIG. 5A, the sharp edge shape may be formed in the edge area of the planarization layer by the ashing process. Although not shown, the reverse taper shape may also be formed in the edge area (or the side surface) of the planarization layer by the ashing process in the same manner as the sharp edge shape.

A reason for determining that the sharp edge shape and/or the reverse taper shape is formed by the ashing process is because, if the ashing process is not performed, an area in which only the passivation layer PAL is present cannot be formed in the non-light emission area without the planarization layer PL, as shown in FIG. 5A. Therefore, it can be seen that the sharp edge shape and/or the reverse taper shape may be formed by the ashing process performed after the photo process.

As shown in FIG. 5A, the thickness of the connection electrode CE on the upper surface of the planarization layer PL may be different from the thickness of the connection electrode CE on the side surface of the planarization layer PL due to the sharp edge shape and/or the reverse taper shape formed in the planarization layer. That is, as in the comparative example of FIG. 5A, where the planarization layer includes a sharp edge shape and/or a reverse taper shape, the thickness of the connection electrode CE formed thereon may be non-uniformly formed. Where the thickness of the connection electrode CE is non-uniform, a resistance deviation may be generated between a thick portion and a thin portion of the connection electrode CE, whereby a signal delay may be generated in the light emission area line and the split line connected to the connection electrode CE to cause a horizontal line defect.

In order to prevent the above problem from occurring, a manufacturing process for the display apparatus 100 according to an example embodiment of the present disclosure may further implement a slit portion in the mask used in the photo process at a position corresponding to the edge area EGA of the planarization layer PL for forming concave grooves to perform the photo process in the non-light emission area NEA. Then, the ashing process may be performed so that the edge area EGA of the planarization layer PL may be provided to have a gentle slope as shown in FIG. 5B.

Therefore, in the display apparatus 100 according to an example embodiment of the present disclosure, the planarization layer PL may be provided to have a gentle slope so that an upper surface of the planarization layer PL is raised toward the central area CA, whereby the connection electrode CE formed on the planarization layer PL may have a more uniform thickness. Thus, a horizontal line defect may be prevented.

For the same reason as described above, in the display apparatus 100 according to an example embodiment of the present disclosure, the thickness T1 of the central area CA of the planarization layer PL may be greater than the thickness T2 of the edge area EGA of the planarization layer PL. The edge area EGA may include a pattern portion PP (see, e.g., FIGS. 3 and 4) formed by the photo process by the slit portion and the ashing process. As described above, the pattern portion PP may be formed on the same layer through the same process as that of the plurality of concave grooves CG (see, e.g., FIG. 4) in the light emission area EA. Therefore, the connection electrode CE formed on the planarization layer PL in the non-light emission area NEA (or the gate driver GD) may be disposed on the same layer as the anode electrode 114 formed on the planarization layer 113 in the light emission area EA.

As a result, in the display apparatus 100 according to an example embodiment of the present disclosure, the planarization layer PL covering a portion of each of the split lines GPL in the non-light emission area NEA (or the non-display area) may be thicker in the central area CA than the edge area EGA, so that the planarization layer PL (or the connection electrode CE) may be provided to have a stair shape (or a cap shape) of a gentle slope, whereby the thickness of the connection electrode CE may be uniformly formed. Therefore, in the display apparatus 100 according to an example embodiment of the present disclosure, since there is small resistance deviation or no resistance deviation between the connection electrode CE on the central area CA and the edge area EGA (or between the connection electrode CE on the upper surface PL1 and on the side surface PL2 of the planarization layer PL), a signal delay may be reduced or avoided, whereby a horizontal line defect may be reduced or avoided.

Also, in the display apparatus 100 according to an example embodiment of the present disclosure, the connection electrode CE disposed on the planarization layer PL is provided to be raised (or to extend upward) toward the central area CA of the planarization layer PL. Therefore, since the thickness of the connection electrode CE on each of the side surface PL2 and the upper surface PL1 of the planarization layer PL may be uniformly provided, no signal delay may be generated, whereby a horizontal line defect may be avoided.

As shown in FIG. 3, in the display apparatus 100 according to an example embodiment of the present disclosure, a width W1 of the central area CA of the planarization layer PL may be provided to be equal to or narrower than a width W2 of a space between the split lines GPL1 and GPL2. The width W1 of the central area CA may be determined by a width of a space between the slit portions of the mask forming the pattern portion PP. Where the space between the slit portions of the mask is wider than the width W2 between the split lines GPL1 and GPL2, the width (or area) of the planarization layer PL exposed to light may be reduced to form a sharp edge shape and/or a reverse taper shape in the planarization layer. Therefore, in the display apparatus 100 according to an example embodiment of the present disclosure, the width W1 of the central area CA of the planarization layer PL may be provided to be equal to or smaller than the width W2 of a space between the split lines GPL1 and GPL2, so that the pattern portion PP having a gentle slope may be formed in the edge area EGA.

Therefore, as shown in FIG. 3, the display apparatus 100 according to an example embodiment of the present disclosure may be provided such that the connection electrode CE formed on the upper surface PL1 of the planarization layer PL has a gentle slope. In addition, the display apparatus 100 according to an example embodiment of the present disclosure may have a structural feature in which the connection electrode CE is provided to be raised (or to extend upward) toward the central area CA from the edge area EGA.

In addition, the passivation layer PAL in the gate driver GD in the non-light emission area NEA may cover a portion of each of the split lines, for example, the first split line GPL1 and the second split line GPL2, and may be disposed between the planarization layer PL and the split lines GPL1 and GPL2. Since the passivation layer PAL in the gate driver GD in the non-light emission area NEA may be formed together with the passivation layer 111*c* in the light emission area EA when the passivation layer 111*c* in the light emission area EA is formed, the passivation layer PAL may be disposed at the lower surface of the planarization layer PL.

In the display apparatus 100 according to an example embodiment of the present disclosure, a width PLW of the planarization layer PL may be provided to be equal to or smaller than a width PALW of the passivation layer PAL. If the width PLW of the planarization layer PL is greater than the width PALW of the passivation layer PAL, a portion of the lower surface of the planarization layer PL may directly be in contact with the upper surface of the split line(s) GPL without being covered by the passivation layer PAL, and external moisture may be more easily permeated into the planarization layer PL. Therefore, in the display apparatus 100 according to an example embodiment of the present disclosure, the width PLW of the planarization layer PL may be provided to be equal to or smaller than the width PALW of the passivation layer PAL, so that the passivation layer PAL protects the lower surface of the planarization layer PL, whereby a moisture permeation path may be blocked. In this case, the width PLW of the planarization layer PL may be provided to be equal to or greater than the width W2 of the space between the split lines GPL1 and GPL2. That is, the width W2 of the space between the split lines GPL1 and GPL2 may be provided to be equal to or smaller than the width PLW of the planarization layer PL. If the width W2 of the space between the split lines GPL1 and GPL2 is greater than the width PLW of the planarization layer PL, a taper of the planarization layer PL (or of the side surface PL2 of the planarization layer PL) may be increased so that the thickness of the connection electrode CE may be non-uniformly formed.

Thus, in the display apparatus 100 according to an example embodiment of the present disclosure, the width PLW of the planarization layer PL may be provided to be equal to or smaller than the width PALW of the passivation layer PAL and to be equal to or greater than the width W2 of the space between the split lines GPL1 and GPL2, whereby a moisture permeation prevention function may be improved and at the same time a horizontal line defect due to a non-uniform thickness of the connection electrode CE may be avoided.

As shown in FIG. 3, in the display apparatus 100 according to an example embodiment of the present disclosure, the side surface PL2 of the planarization layer PL may form a first angle θ1 with the upper surface PAL1 of the passivation layer PAL that is in contact with the connection electrode CE. In this case, the first angle θ1 may be an obtuse angle. The planarization layer PL in the non-light emission area NEA may be patterned to cover a portion of each of the split lines GPL1 and GPL2. In this case, since the pattern material is sequentially etched from the upper surface of the planarization layer PL toward the bottom of the planarization layer PL, the width of the planarization layer PL may become greater toward the substrate 110. Therefore, the side surface PL2 of the planarization layer PL may form an obtuse angle with the upper surface PAL1 of the passivation layer PAL that is in contact with the connection electrode CE.

In the display apparatus 100 according to an example embodiment of the present disclosure, the upper surface PL1 of the planarization layer PL may form a second angle θ2 with the side surface PL2 of the planarization layer PL. In this case, the second angle θ2 may be an obtuse angle. The planarization layer PL covering a portion of each of the split lines GPL1 and GPL2 may include the pattern portions PP formed through the photo process using the slit portions positioned to correspond to the edge areas EGA during the manufacturing process and the ashing process. As shown in FIG. 5A, in the comparative example, the upper surface and the side surface of the planarization layer form an acute angle due to a sharp edge shape. On the other hand, in the display apparatus 100 according to an example embodiment of the present disclosure, since the pattern portion PP may be formed to be gently raised toward the central area CA, the upper surface PL1 of the planarization layer PL and the side surface PL2 of the planarization layer PL may form an obtuse angle. Therefore, the display apparatus 100 according to an example embodiment of the present disclosure may be provided to have a profile in which the upper surface PL1 and/or the side surface PL2 of the planarization layer PL is gently raised toward the central area CA, so that the connection electrode CE may be formed to have a uniform thickness, thereby preventing a horizontal line defect from occurring. As shown in FIG. 3, the display apparatus 100 according to an example embodiment of the present disclosure may be provided with a planarization layer PL having a profile in a stair shape to be raised (or to extend upward) toward the central area CA of the planarization layer PL, thereby including a structural feature in which the upper surface PL1 of the planarization layer PL is not disposed to be closer to the substrate 110 than the uppermost end of the side surface PL2 of the planarization layer PL.

Also, since the upper surface PAL1 of the passivation layer PAL that is in contact with the connection electrode CE and the side surface PL2 of the planarization layer PL form an obtuse angle, the upper surface PAL1 of the passivation layer PAL overlapping with the planarization layer PL may form a third angle θ3 with the side surface PL2 of the planarization layer PL. In this case, the third angle θ3 may be an acute angle. As described above, in the process of patterning the planarization layer PL to cover a portion of each of the split lines GPL1 and GPL2, since the pattern material etches the planarization layer PL from the upper surface of the planarization layer PL toward the substrate 110, the width of the planarization layer PL may become wider from the upper surface PL1 toward the substrate 110. Therefore, the side surface PL2 of the planarization layer PL may form an acute angle with the upper surface PAL1 of the passivation layer PAL overlapping with the planarization layer PL.

As a result, the display apparatus 100 according to an example embodiment of the present disclosure may have a structural feature in which the planarization layer PL is provided in a stair shape (or a cap shape) having a gentle slope, so that the connection electrode CE covering the planarization layer PL may be provided in a stair shape to be raised from a portion in contact with the split line GPL toward the central area CA of the planarization layer PL. Therefore, as shown in FIG. 3, the connection electrode CE may be respectively in contact with upper surfaces GPL11 and GPL21 of the respective split lines GPL1 and GPL2, the upper surface PAL1 and the side surface PAL2 of the passivation layer PAL, and the side surface PL2 and the upper surface PL1 of the planarization layer PL.

Here, since the planarization layer PL is disposed to cover a portion of each of the first split line GPL1 and the second split line GPL2, which are spaced apart from each other, the central area CA of the planarization layer PL may overlap the passivation layer PAL, but not the split lines GPL. Also, the edge area EGA of the planarization layer PL may partially overlap both the passivation layer PAL and the first split line GPL1 (or the second split line GPL2). For example, a predetermined edge area EGA including the side surface PL2 of the planarization layer PL may overlap both the passivation layer PAL and the first split line GPL1 (or the second split line GPL2). Therefore, as shown in FIG. 3, the thickness T1 of the central area CA of the planarization layer PL may be greater than the thickness T2 of the edge area EGA.

As shown in FIG. 3, in the display apparatus 100 according to an example embodiment of the present disclosure, the planarization layer PL may be provided to be gently raised from the edge area EGA toward the central area CA, so that the thickness of the connection electrode CE may be uniformly formed. Therefore, the display apparatus 100 according to an example embodiment of the present disclosure may reduce or prevent a resistance deviation from a portion of the connection electrode CE in contact with the first split line GPL1 to a portion of the connection electrode CE in contact with the second split line GPL2, whereby a signal delay of the light emission area line SL connected to the second split line GPL2 may be reduced or avoided to reduce or avoid a horizontal line defect.

Hereinafter, with reference to FIGS. 6A to 7B, a signal delay reduction or prevention effect of a display apparatus 100 according to an example embodiment of the present disclosure will be described in conjunction with a circuit structure and a variation graph of a signal and a voltage (or current). Also, an effect of reducing or avoiding a horizontal line defect will be described in conjunction with an image.

Figure 6A:
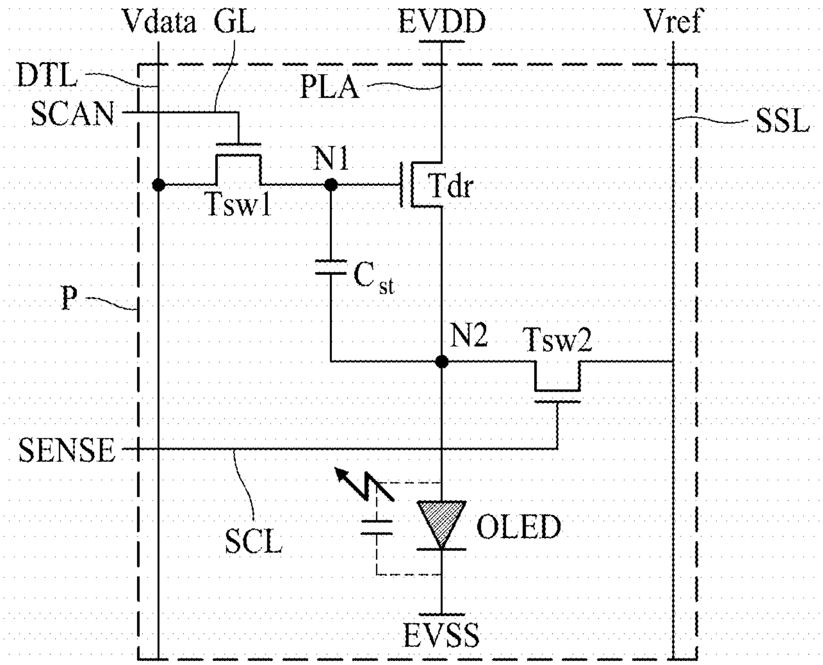
FIG. 6A is a schematic circuit view illustrating a pixel of a display apparatus according to an example embodiment of the present disclosure.
Figure 6B:
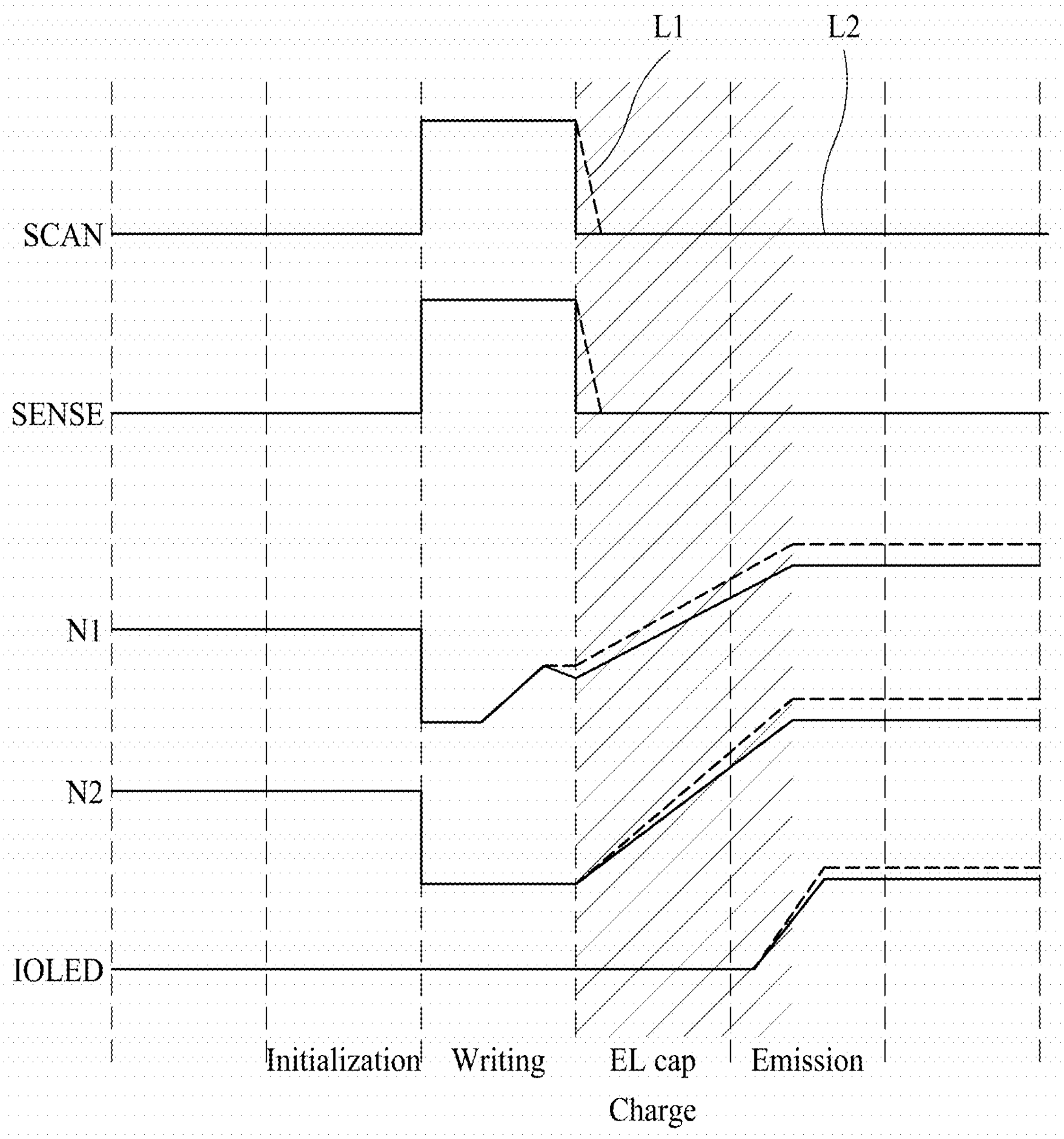
FIG. 6B is a graph illustrating signals and voltages in a display apparatus according to an example embodiment of the present disclosure compared with those in a comparative example.
Figure 7A:
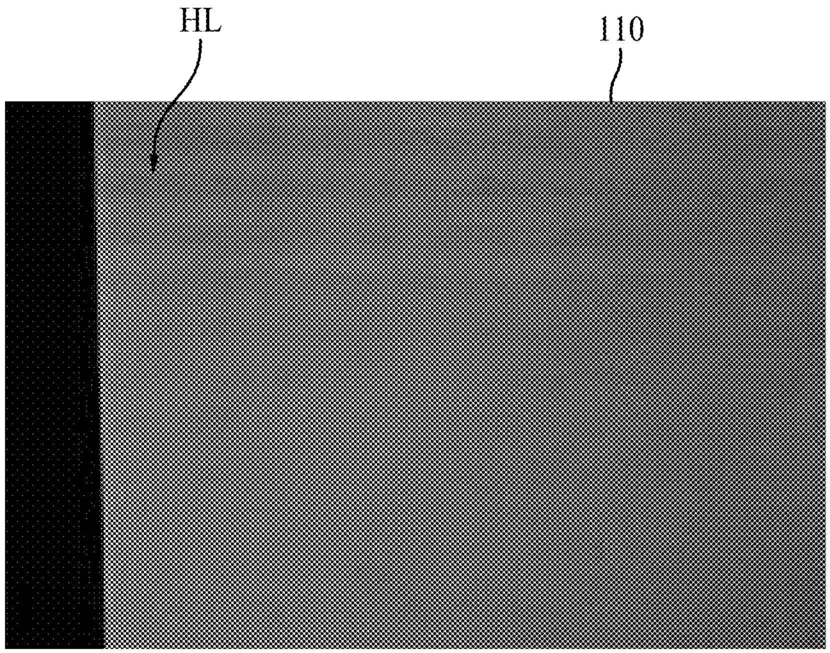
FIG. 7A is an image showing a horizontal line defect in the comparative example.
Figure 7B:
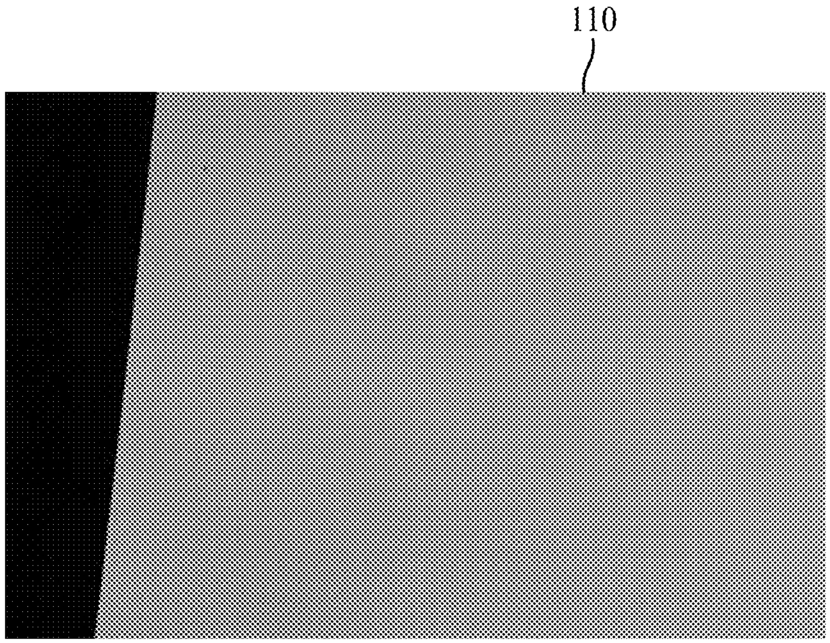
FIG. 7B is an image in which a horizontal line defect is reduced or avoided in a display apparatus according to an example embodiment of the present disclosure.

FIG. 6A is a schematic circuit view illustrating a pixel of a display apparatus according to an example embodiment of the present disclosure. FIG. 6B is a graph illustrating signals and voltages of a display apparatus according to an example embodiment of the present disclosure compared with those of a comparative example. FIG. 7A is an image showing a horizontal line defect in the comparative example, and FIG. 7*b* is an image in which a horizontal line defect of a display apparatus according to an example embodiment of the present disclosure is reduced or avoided.

As shown in FIG. 6A, the pixel P of the display apparatus 100 according to an example embodiment of the present disclosure may include a pixel driving circuit that includes a switching transistor Tsw1, a storage capacitor Cst, a driving transistor Tdr, a sensing transistor Tsw2, and a light emitting element OLED. The light emitting element OLED may include an anode electrode 114, an organic light emitting layer 115 and a cathode electrode 116 (see, e.g., FIG. 4).

A first terminal of the driving transistor Tdr may be connected to a high voltage supply line PLA to which a high voltage EVDD is supplied, and a second terminal of the driving transistor Tdr may be connected to the light emitting diode OLED through a second node N2. A first terminal of the switching transistor Tsw1 may be connected to a data line DTL, and a second terminal of the switching transistor Tsw1 may be connected to a gate of the driving transistor Tdr. A gate of the switching transistor Tsw1 may be connected to a gate line GL.

A data voltage Vdata may be supplied to a data line DTL, and a gate signal SCAN may be supplied to the gate line GL. In order to measure a threshold voltage or mobility of the driving transistor Tdr, the sensing transistor Tsw2 may be provided. A first terminal of the sensing transistor Tsw2 may be connected to a second terminal of the driving transistor Tdr and the light emitting element OLED through the second node N2, and a second terminal of the sensing transistor Tsw2 may be connected to a sensing line SSL to which a reference voltage Vref is supplied. A gate of the sensing transistor Tsw2 may be connected to a sensing control line SCL to which a sensing control signal SENSE is supplied.

A first node N1 may be disposed between the switching transistor Tsw1 and the driving transistor Tdr. The first node N1 may be connected to a storage capacitor Cst. The second node N2 may be disposed between the driving transistor Tdr and the light emitting element OLED. The second node N2 may be connected to the storage capacitor Cst and the sensing transistor Tsw2.

The sensing line SSL may be connected to a data driver and may be connected to a power supply (not shown) through the data driver. That is, the reference voltage Vref supplied from the power supply may be supplied to the pixels through the sensing line SSL, and the sensing signals transmitted from the pixels may be processed by the data driver.

The structure of the pixel P included in the display apparatus 100 according to an example embodiment of the present disclosure is not limited to the structure shown in FIG. 6A and may be modified in various forms.

FIG. 6B graphically illustrates a variation of each of the gate signal SCAN, the sensing control signal SENSE, a voltage at the first node N1, a voltage at the second node N2, and a current IOLED of the light emitting element OLED in an initialization step, a writing step, an EL cap charge step, and an emission step. L1 (shown in dashed lines) indicates signal variations, variations in voltage (or current) intensity, and variations in light emission intensity in the comparative example. L2 indicates signal variations, variations in voltage (or current) intensity, and variations in light emission intensity in the display apparatus 100 according to an example embodiment of the present disclosure.

The initialization step may be a step of setting a reference voltage of the first node N1 and the second node N2. The writing step may be a step of applying the data voltage Vdata. The EL cap charge step may be a step of charging a voltage for driving the light emitting element OLED. The emission step may be a step of allowing the light emitting element OLED to emit light.

As shown in FIG. 6B, the gate signal SCAN does not have a difference between L1 and L2 until the writing step is performed. However, in the EL cap charge step, since the resistance deviation occurs due to non-uniformity in the thickness of the connection electrode in the comparative example, the gate signal SCAN may be delayed (see L1) as compared with that (see L2) in the display apparatus 100 according to an example embodiment of the present disclosure. As the gate signal is delayed, the comparative example may have a problem in which a horizontal line HL is generated in a displayed image, as shown in FIG. 7A. On the other hand, in the display apparatus 100 according to an example embodiment of the present disclosure, the gate signal SCAN may be normally applied to the switching transistor Tsw1 without being delayed, so that a horizontal line HL may not be generated in the displayed image, as shown in FIG. 7B.

The sensing control signal SENSE does not have a difference between L1 and L2 until the writing step is performed. However, in the EL cap charge step of the comparative example, since the resistance deviation occurs due to the non-uniformity in the thickness of the connection electrode, the sensing control signal SENSE may be delayed as compared with that in the display apparatus 100 according to an example embodiment of the present disclosure. As the sensing control signal SENSE is delayed, the comparative example may have a problem in which a horizontal line HL may be generated in the displayed image, as shown in FIG. 7A. On the other hand, in the display apparatus 100 according to an example embodiment of the present disclosure, the sensing control signal SENSE may be normally applied to the sensing transistor Tsw2 without being delayed, so that a horizontal line HL may not be generated in the displayed image, as shown in FIG. 7B.

The voltage at the first node N1 does not have a difference between L1 and L2 until the initialization step is performed. However, in the writing step of the comparative example, since the resistance deviation occurs due to the non-uniformity in the thickness of the connection electrode, a current value may be greater than that in the display apparatus 100 according to an example embodiment of the present disclosure in which the connection electrode CE has a uniform thickness. Therefore, since the gate voltage applied to the first node N1 is higher in the comparative example than that in the display apparatus 100 according to an example embodiment of the present disclosure, the lifetime of the storage capacitor Cst connected to the first node N1 may be shortened in the comparative example.

The voltage at second node N2 does not have a difference between L1 and L2 until the writing step is performed. However, in the EL cap charge step of the comparative example, since the resistance deviation occurs due to the non-uniformity in the thickness of the connection electrode, a current value may be greater than that in the display apparatus 100 according to an example embodiment of the present disclosure in which the connection electrode CE has a uniform thickness. Therefore, since the voltage applied from the storage capacitor Cst to the second node N2 is higher in the comparative example than that in the display apparatus 100 according to an example embodiment of the present disclosure, the lifetime of the OLED connected to the second node N2 may be shortened in the comparative example.

The current IOLED of the light emitting element OLED does not have a difference between L1 and L2 until the EL cap charge step is performed. However, in the emission step of the comparative example, since the resistance deviation occurs due to the non-uniformity in the thickness of the connection electrode, a current value may be greater than that in the display apparatus 100 according to an example embodiment of the present disclosure in which the connection electrode CE has a uniform thickness. Therefore, brighter light may be emitted than that in the display apparatus 100 according to an example embodiment of the present disclosure. In this case, the lifetime of the light emitting element OLED in the comparative example may be more shortened than that of the display apparatus 100 according to an example embodiment of the present disclosure.

As a result, in the display apparatus 100 according to an example embodiment of the present disclosure, the connection electrode CE on the planarization layer PL may be provided to have a uniform thickness so that a signal delay may be avoided, whereby a horizontal line defect may be prevented from occurring. Also, in the display apparatus 100 according to an example embodiment of the present disclosure, the connection electrode CE on the planarization layer PL may be provided to have a uniform thickness, so that a voltage (or current) may be stably applied to the circuit elements including the light emitting element OLED without delay, whereby the lifetime of the circuit elements may be prevented from being shortened.

FIG. 8 is a plan view illustrating a portion of a gate driver of a display apparatus according to an example embodiment of the present disclosure.

As shown in FIG. 8, the gate driver GD in the non-light emission area NEA may include a first area A1, a second area A2, a third area A3, and a fourth area A4.

For example, the first area A1 may be an area positioned at the outermost portion of the gate driver GD. For another example, with reference to FIGS. 1 and 8, the first area A1 may be an area spaced farther from the light emission area EA than the second to fourth areas A2, A3 and A4. The light emission area EA may be disposed to be closer to the fourth area A4, the third area A3, the second area A2, and the first area A1 in the order of decreasing proximity.

The gate driver GD may include a plurality of GIP circuits GIP, and a plurality of GIP lines GPL that respectively include a first split line GPL1 and a second split line GPL2. The second split line GPL2 may not be electrically connected to the first split line GPL1 to prevent static electricity from occurring until the second split line GPL2 is connected to the first split line GPL1 through the connection electrode CE at or near the final stage of a manufacturing process. Therefore, the second split line GPL2 may be disposed to be spaced apart from the first split line GPL1. The second split line GPL2 may be disposed only in the gate driver GD.

As shown in FIGS. 1 and 8, the plurality of GIP circuits GIP may be disposed between the plurality of GIP lines (or the split lines GPL) and the light emission area EA. Although not shown, since FIG. 8 illustrates a portion of the gate driver GD, the light emission area may be disposed at a right side of the fourth area A4. Therefore, the plurality of GIP circuits GIP may be disposed between the plurality of GIP lines (or the split lines GPL) and the light emission area EA. For example, as shown in FIG. 8, the GIP circuits GIP may be disposed in the fourth area A4.

As shown in FIG. 8, since the plurality of GIP lines GPL may be disposed only at a left side of the plurality of GIP circuits GIP, the GIP lines GPL may be prevented from being twisted or overlapping with each other, as compared with an example in which the GIP circuits GIP are disposed between the GIP lines GPL. Where the GIP lines GPL are twisted or overlap with each other, signal interference may occur, and thus noise may be generated in the image. In this case, the GIP lines GPL may refer to a first split line GPL1 connected to the pad area PA.

In the display apparatus 100 according to an example embodiment of the present disclosure, the plurality of GIP circuits GIP may be disposed between the plurality of GIP lines (or the split lines GPL) and the light emission area EA so that the plurality of GIP lines GPL may be disposed only at one side (e.g., the left side) of the GIP circuits GIP, whereby the GIP lines GPL may be prevented from being twisted. Thus, signal interference may be avoided.

The plurality of GIP lines GPL (or the first split lines GPL1) may include a plurality of scan clock lines SECLK, a plurality of carry clock lines CRCLK, and a plurality of pixel power lines GVDDL. As shown in FIG. 8, the plurality of scan clock lines SECLK, the plurality of carry clock lines CRCLK, and the plurality of pixel power lines GVDDL may be disposed to extend in the second direction, unlike the light emission area line SL disposed in the first direction, and may be disposed to be spaced apart from each other in the first direction.

The plurality of scan clock lines SECLK, the plurality of carry clock lines CRCLK, and the plurality of pixel power lines GVDDL may be included in the first split line GPL1. However, a line that is not connected to a second split line GPL2 through a connection electrode CE may not be included in the first split line GPL1. For example, as shown in FIG. 8, since the connection electrodes CE are not disposed in the second area A2, the plurality of carry clock lines CRCLK may not be included in the first split lines GPL1, but the present disclosure is not limited thereto. The plurality of carry clock lines CRCLK may be also included in the first split lines GPL1 if the plurality of carry clock lines CRCLK may be connected respectively to the second split lines GPL2 through corresponding connection electrodes CE.

Also as shown in FIG. 8, the plurality of scan clock lines SECLK may be disposed in the first area A1. Each of the plurality of scan clock lines SECLK may be connected respective to the second split lines GPL2 through the corresponding connection electrodes CE as shown in FIGS. 2, 3, and 8, but the present disclosure is not limited thereto. Only a portion of the plurality of scan clock lines SECLK may be selectively connected respectively to the second split lines GPL2 through the corresponding connection electrode CE. The second split lines GPL2 may be connected respectively to the plurality of GIP circuits GIP in the fourth area A4 through corresponding connection lines CNL disposed in the first direction. The connection lines CNL may be disposed only in the gate driver GD but is not limited thereto. Since the connection lines CNL may be disposed in the first direction, the connection lines CNL may also be included in the light emission area lines SL.

As shown in FIG. 8, a plurality of connection electrodes CE may be disposed in the first area A1. The plurality of connection electrodes CE disposed in the first area A1 may be disposed to be spaced apart from each other. This is because a signal interference or signal error may occur if the connection electrodes CE disposed in the first area A1 overlap or contact each other.

The second area A2 may be an area positioned between the first area A1 and the third area A3. The plurality of carry clock lines CRCLK may be disposed in the second area A2. As shown in FIG. 8, since the connection electrodes CE are not disposed in the second area A2, the plurality of carry clock lines CRCLK may not be connected to the plurality of GIP circuits GIP through the connection electrodes CE, but the present disclosure is not limited thereto. The plurality of carry clock lines CRCLK may be connected respectively to the second split lines GPL2 through the corresponding connection electrodes CE. In this case, the second split lines GPL2 may be connected respectively to the plurality of GIP circuits GIP in the fourth area A4 through the corresponding connection line CNL disposed in the first direction.

The third area A3 may be an area positioned between the second area A2 and the fourth area A4. The plurality of pixel power lines GVDDL may be disposed in the third area A3. The plurality of pixel power lines GVDDL may be connected respectively to the second split lines GPL2 through the corresponding connection electrodes CE as shown in FIGS. 2, 3, and 8, but the present disclosure is not limited thereto. Only a portion of the plurality of pixel power lines GVDDL may be selectively connected respectively to the second split lines GPL2 through the corresponding connection electrodes CE. The second split lines GPL2 may be connected respectively to the plurality of GIP circuits GIP in the fourth area A4 through the corresponding connection line CNL disposed in the first direction.

As shown in FIG. 8, a plurality of connection electrodes CE may be disposed in the third area A3. The plurality of connection electrodes CE disposed in the third area A3 may be disposed to be spaced apart from each other. This is because a short may occur or a pixel power source may be supplied to a pixel P from which light should not be emitted if the connection electrodes CE disposed in the third area A3 overlap or contact each other.

In the display apparatus 100 according to an example embodiment of the present disclosure, the plurality of connection electrodes CE may be disposed in the first area A1 and the third area A3. Therefore, the scan clock lines SECLK in the first area A1 may be connected respectively to the GIP circuits GIP through the corresponding connection electrodes CE, the corresponding second split lines GPL2, and the corresponding connection lines CNL. The pixel power lines GVDDL in the third area A3 may be connected respectively to the GIP circuits GIP through the corresponding connection electrodes CE, the corresponding second split lines GPL2, and the corresponding connection lines CNL, but the present disclosure is not limited thereto. The plurality of connection electrodes CE may be also disposed in the second area A2. In this case, the carry clock lines CRCLK in the second area A2 may be connected respectively to the GIP circuit GIP through the corresponding connection electrode CE, the corresponding second split line GPL2, and the corresponding connection line CNL.

The fourth area A4 may be an area positioned between the third area A3 and the light emission area EA. The plurality of GIP circuits GIP for driving the plurality of pixels P may be disposed in the fourth area A4. As shown in FIG. 8, the first split lines GPL1 in each of the first area A1 and the third area A3 may be selectively connected respectively to the plurality of GIP circuits GIP in the fourth area A4 through the corresponding connection electrodes CE, the corresponding second split lines GPL2, and the corresponding connection lines CNL. The connection lines CNL may be connected respectively to one side of the corresponding GIP circuits GIP, and the light emission area lines SL connected to the pixels P may be connected to the other side of the GIP circuits GIP. Therefore, the plurality of GIP circuits GIP may receive a signal or power source from the pad area PA through the split lines GPL to drive the plurality of pixels P through the light emission area lines SL.

In addition, the plurality of connection electrodes CE may be formed to have a size that does not generate a signal interference due to the thickness and spacing of the GIP lines disposed in the gate driver GD. Therefore, as shown in FIG. 8, the plurality of connection electrodes CE may be formed to have various sizes and areas within the gate driver GD.

According to example embodiments of the present disclosure, the following advantageous effects may be obtained.

In example embodiments of the present disclosure, the planarization layer covering a portion of each of the split lines in the non-light emission area (or the gate driver) may be provided to have a different thickness in the edge area(s) from the central area, or the connection electrode disposed on the planarization layer covering a portion of each of the split lines in the non-light emission area (or the gate driver) may be provided to be raised (or to extend upward) toward the central area of the planarization layer. Since the thickness of the connection electrode on the side surface and the upper surface of the planarization layer may be uniformly provided, a signal delay may be reduced or avoided, whereby a horizontal line defect may be reduced or avoided.

In example embodiments of the present disclosure, the planarization layer covering a portion of each of the split lines in the non-light emission area (or the gate driver) may be provided to be thicker in the central area than in the edge area(s), so that the planarization layer (or the upper surface of the planarization layer) may be provided in a stair shape (or a cap shape) having a gentle slope, whereby the thickness of the connection electrode disposed on the planarization layer may be uniformly formed, and the resistance deviation may be reduced or avoided.

It will be apparent to those skilled in the art that the present disclosure described above is not limited by the above-described example embodiments and the accompanying drawings and that various substitutions, modifications, and variations can be made in the present disclosure without departing from the spirit or scope of the disclosures. Thus, it is intended that the present disclosure cover all modifications and variations of this disclosure that come within the scope of the appended claims and their equivalents.

What is claimed is:

1. A display apparatus, comprising:

a substrate having a light emission area, including a pixel, and a non-light emission area in a periphery of the light emission area;

a plurality of split lines spaced apart from each other in the non-light emission area, the split lines being configured to provide a signal for driving the pixel;

a planarization layer in the non-light emission area and overlapping with a portion of each of the split lines; and a connection electrode covering the planarization layer in the non-light emission area and connecting the split lines to each other, wherein the planarization layer includes a central area and an edge area in a periphery of the central area, the central area having a different thickness from the edge area, and wherein a width of a space between the split lines is equal to or smaller than a width of the planarization layer.

2. The display apparatus of claim 1, wherein a thickness of the central area of the planarization layer is greater than a thickness of the edge area of the planarization layer.

3. The display apparatus of claim 1, wherein a width of the central area of the planarization layer is equal to or smaller than a width of a space between the split lines.

4. The display apparatus of claim 1, wherein the connection electrode extends upward from the edge area to the central area of the planarization layer.

5. The display apparatus of claim 1, further comprising a passivation layer covering a portion of each of the split lines and disposed between the planarization layer and the split lines, wherein a width of the planarization layer is equal to or smaller than a width of the passivation layer.

6. The display apparatus of claim 1, further comprising a passivation layer between the planarization layer and the split lines, wherein the planarization layer includes an upper surface and a side surface extending from the upper surface of the planarization layer to the passivation layer, and wherein the side surface of the planarization layer forms an obtuse angle with an upper surface of the passivation layer that is in contact with the connection electrode.

7. The display apparatus of claim 1, wherein an upper surface of the planarization layer meets a side surface of the planarization layer at an obtuse angle.

8. The display apparatus of claim 1, further comprising a planarization layer in the light emission area, the planarization in the light emission area including an upper surface with a plurality of concave grooves, wherein the planarization layer in the non-light emission area includes an upper surface with a concave pattern in the edge area, and wherein the planarization layer in the light emission area and the planarization in the non-light emission area are formed from a same layer.

9. The display apparatus of claim 1, further comprising:

a coating layer covering the planarization layer in the non-light emission area; and an encapsulation layer in contact with an upper surface of the coating layer, wherein the coating layer has a flat upper surface overlapping each of the central area and the edge area of the planarization layer in the non-light emission area, and wherein a lower surface of the encapsulation layer is in contact with the flat upper surface of the coating layer.

10. The display apparatus of claim 9, further comprising:

a planarization layer in the light emission area on a same layer as the planarization layer in the non-light emission area;

an anode electrode on the planarization layer in the light emission area; and an organic light emitting layer on the anode electrode, wherein the coating layer extends to the light emission area and covers an edge of the anode electrode.

11. The display apparatus of claim 10, wherein the anode electrode is on a same layer as the connection electrode.

12. The display apparatus of claim 10, further comprising a cathode electrode on the organic light emitting layer in the light emission area, wherein the encapsulation layer extends to the light emission area and is disposed on the cathode electrode.

13. A display apparatus, comprising:

a substrate having a light emission area, including a pixel, and a non-light emission area in a periphery of the light emission area;

a plurality of split lines spaced apart from each other in the non-light emission area, the split lines being configured to provide a signal for driving the pixel;

a passivation layer covering a portion of each of the split lines;

a planarization layer on the passivation layer; and a connection electrode covering the planarization layer and the passivation layer and connecting the split lines to each other, wherein the connection electrode has a stair shape extending upward from a portion in contact with one of the split lines toward a central area of the planarization layer, and wherein a width of a space between the split lines is equal to or smaller than a width of the planarization layer.

14. The display apparatus of claim 13, wherein a thickness of the central area of the planarization layer is greater than a thickness of an edge area of the planarization layer in a periphery of the central area.

15. The display apparatus of claim 14, wherein:

the central area of the planarization layer overlaps the passivation layer without overlapping the split lines, and the edge area of the planarization layer partially overlaps with both the passivation layer and at least one of the split lines.

16. The display apparatus of claim 13, wherein:

the planarization layer includes a side surface extending to the passivation layer, and the side surface of the planarization layer forms an acute angle with an upper surface of the passivation layer overlapping with the planarization layer.

17. The display apparatus of claim 13, wherein an upper surface of the planarization layer meets a side surface of the planarization layer at an obtuse angle.

18. The display apparatus of claim 13, wherein:

a width of the planarization layer is smaller than a width of the passivation layer, and the connection electrode contacts an upper surface of each of the split lines, an upper surface and a side surface of the passivation layer, and a side surface and an upper surface of the planarization layer.

19. A display apparatus, comprising:

a substrate having a light emission area, including a pixel, and a non-light emission area in a periphery of the light emission area, the non-light emission area including a pad area having a plurality of pads;

a first split line in the non-light emission area and connected to one of the pads in the pad area;

a second split line spaced apart from the first split line in the non-light emission area and connected to a line in the light emission area connected to the pixel;

a planarization layer overlapping with a portion of each of the first and second split lines in the non-light emission area; and a connection electrode covering the planarization layer and electrically connecting the first split line with the second split line, wherein the planarization layer includes a central area and an edge area in a periphery of the central area, the central area having a different thickness from the edge area, and wherein a width of a space between the first split line and the second split line is equal to or smaller than a width of the planarization layer.

20. The display apparatus of claim 19, further comprising a gate driver in the non-light emission area and spaced apart from the pad area, wherein the gate driver includes a plurality of gate-in-panel (GIP) circuits and a plurality of GIP lines respectively connected to the GIP circuits, the GIP lines including the first and second split lines, and wherein the second split line is disposed in the gate driver and does not extend to the pad area.

21. The display apparatus of claim 20, wherein the plurality of GIP circuits are disposed between the plurality of GIP lines and the light emission area.

22. The display apparatus of claim 20, wherein:

the gate driver includes a first area, a second area, a third area, and a fourth area, which are disposed adjacent to one another between an edge of the substrate and the light emission area, the light emission area is disposed near the fourth area, the third area, the second area, and the first area in an order of decreasing proximity, and the plurality of GIP circuits are disposed in the fourth area closest to the light emission area among the first to the fourth areas.

23. The display apparatus of claim 22, further comprising a plurality of connection electrodes in the first area and the third area and spaced apart from each other, the plurality of connection electrodes including the connection electrode electrically connecting the first and second split lines.

24. The display apparatus of claim 22, wherein:

the plurality of GIP lines include a plurality of scan clock lines, a plurality of carry clock lines, and a plurality of pixel power lines, the plurality of scan clock lines are disposed in the first area, the plurality of carry clock lines are disposed in the second area, and the plurality of pixel power lines are disposed in the third area.

* * * * *